(12) United States Patent
Camarota

(10) Patent No.: US 11,189,338 B1
(45) Date of Patent: Nov. 30, 2021

(54) MULTI-RANK HIGH BANDWIDTH MEMORY (HBM) MEMORY

(71) Applicant: XILINX, INC., San Jose, CA (US)

(72) Inventor: Rafael C. Camarota, San Jose, CA (US)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 16/833,043

(22) Filed: Mar. 27, 2020

(51) Int. Cl.
| | |
|---|---|
| *G11C 5/02* | (2006.01) |
| *G11C 11/4096* | (2006.01) |
| *H01L 23/00* | (2006.01) |
| *H01L 23/14* | (2006.01) |
| *H01L 23/538* | (2006.01) |
| *H01L 25/18* | (2006.01) |

(52) U.S. Cl.
CPC ........ *G11C 11/4096* (2013.01); *H01L 23/145* (2013.01); *H01L 23/538* (2013.01); *H01L 24/08* (2013.01); *H01L 24/09* (2013.01); *H01L 25/18* (2013.01); *H01L 24/16* (2013.01); *H01L 24/17* (2013.01); *H01L 2224/16145* (2013.01); *H01L 2224/16227* (2013.01); *H01L 2224/17181* (2013.01); *H01L 2924/14361* (2013.01)

(58) Field of Classification Search
CPC . G11C 11/4096; H01L 23/145; H01L 23/538; H01L 24/08; H01L 24/09; H01L 25/18
See application file for complete search history.

(56) References Cited

U.S. PATENT DOCUMENTS

| | | | |
|---|---|---|---|
| 8,626,998 B1 | 1/2014 | Amidi et al. | |
| 10,141,935 B2 | 11/2018 | Bains et al. | |
| 10,424,571 B2* | 9/2019 | Choi | H01F 27/2804 |
| 10,770,430 B1* | 9/2020 | Kim | H01L 25/18 |
| 10,847,447 B2* | 11/2020 | Kim | H01L 23/5385 |
| 10,871,906 B2* | 12/2020 | Teh | G06F 3/0629 |
| 2006/0129755 A1 | 6/2006 | Raghuram | |
| 2013/0021866 A1 | 1/2013 | Lee | |
| 2017/0092379 A1 | 3/2017 | Kim et al. | |

OTHER PUBLICATIONS

"High Bandwith Memory (HBM2) Interface Intel FPGA IP User Guide", Intel, UG-20031, Sep. 19, 2019 (76 pages).

* cited by examiner

*Primary Examiner* — Pho M Luu
(74) *Attorney, Agent, or Firm* — Patterson + Sheridan, LLP

(57) ABSTRACT

Certain aspects of the present disclosure provide techniques for relate to electronic devices that are configured to implement multi-rank high bandwidth memory (HBM) memory. In one aspect, an electronic device includes a chip that includes an interface circuit. The interface circuit is connected to first exterior pads. The first exterior pads have a first number of first data input/output exterior pads and a second number of clock enable output exterior pads. The first number is a first integer multiple of a number of data signals per channel of high bandwidth memory (HBM), and the second number is a second integer multiple of a number of clock enable signals per channel of the HBM. The second integer multiple is greater than the first integer multiple.

20 Claims, 5 Drawing Sheets

MULTI-RANK HIGH BANDWIDTH MEMORY (HBM) MEMORY

TECHNICAL FIELD

This disclosure relates to an electronic device configured to implement multi-rank high bandwidth memory (HBM) memory.

BACKGROUND

Electronic devices (e.g., computers, laptops, tablets, copiers, digital cameras, smart phones, and the like) often employ integrated circuits (ICs). These integrated circuits are typically implemented as IC chips packaged in packages. The IC chips may include processors, programmable logic circuits, application specific ICs, memory, and/or any of various other suitable circuit types.

Memory is commonly incorporated into various electronic devices. ICs within the electronic devices can communicate with the memory. A number of technologies have been created for different types of memory. High bandwidth memory (HBM) is one such technology. HBM is an interface for random access memory (RAM) that is defined by a specification adopted by the JEDEC. HBM provides for low latency, high bandwidth access to memory by an IC. However, limitations of HBM are still present.

SUMMARY

Some examples described herein relate to electronic devices that are configured to implement multi-rank high bandwidth memory (HBM) memory. Various benefits can be achieved, such as increased capacity and depth of HBM memory and/or flexibility in the electronic device.

In an example, an electronic device includes a chip that includes an interface circuit. The interface circuit is connected to first exterior pads. The first exterior pads have a first number of first data input/output exterior pads and a second number of clock enable output exterior pads. The first number is a first integer multiple of a number of data signals per channel of HBM, and the second number is a second integer multiple of a number of clock enable signals per channel of the HBM. The second integer multiple is greater than the first integer multiple.

An example is a method for operating an electronic device. Data is written to memory of one or more HBM chip stacks through an interface circuit of an integrated circuit (IC) chip. The IC chip is disposed on and attached to a substrate. The interface circuit is connected to exterior pads of the IC chip. The one or more HBM chip stacks is disposed on and attached to the substrate. Respective data exterior pads of a plurality of channels of the one or more HBM chip stacks are connected in parallel through parallel interconnections in the substrate. Clock enable exterior pads of the plurality of channels of the one or more HBM chip stacks are connected to channel separate interconnections in the substrate. The parallel interconnections and the channel separate interconnections are connected to the exterior pads of the IC chip connected to the interface circuit. Data is read from memory of the one or more HBM chip stacks through the interface circuit. During the writing and reading, data that is written and read, respectively, is communicated through respective parallel interconnections, and a clock enable signal is asserted enabled through a channel separate interconnection.

In an example, an electronic device includes a substrate, an IC chip, and one or more HBM chip stacks. The IC chip is disposed on and attached to the substrate. The IC chip includes an interface circuit connected to exterior pads. The one or more HBM chip stacks are disposed on and attached to the substrate. Respective data exterior pads of a plurality of channels of the one or more HBM chip stacks are connected in parallel through parallel interconnections in the substrate. Clock enable exterior pads of the plurality of channels of the one or more HBM chip stacks are connected to channel separate interconnections in the substrate. The parallel interconnections and the channel separate interconnections are connected to the exterior pads of the IC chip connected to the interface circuit.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
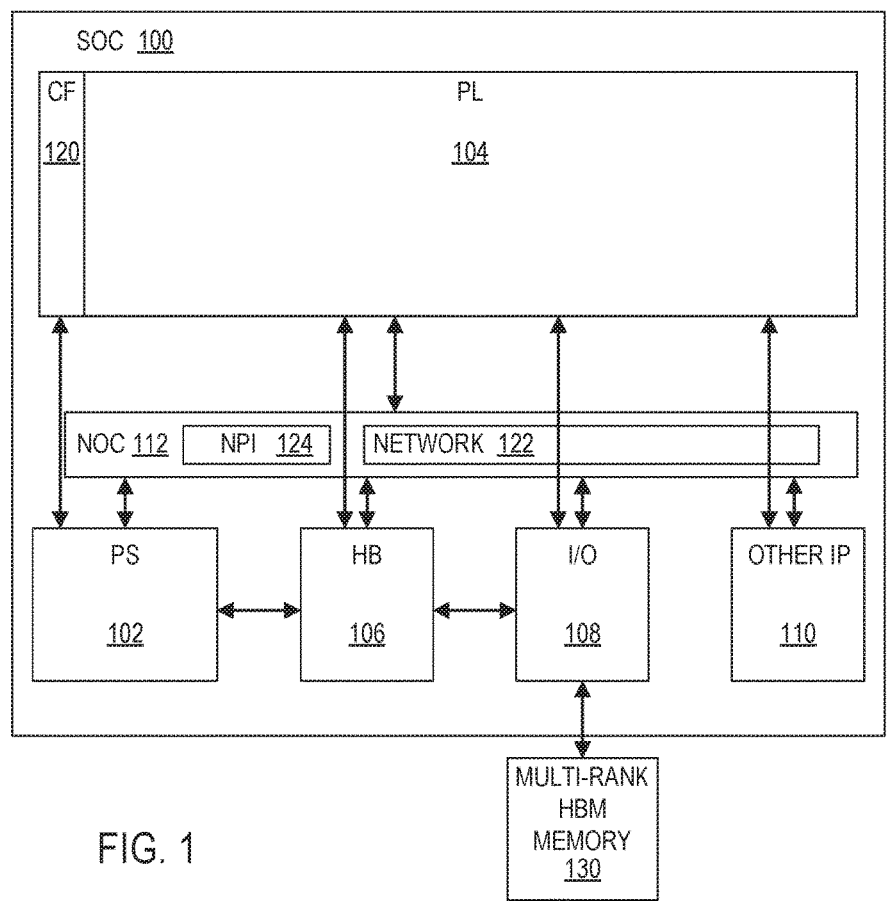
FIG. 1 depicts an architecture for an electronic device according to some examples.

Some examples described herein relate to electronic devices that are configured to implement multi-rank high bandwidth memory (HBM) memory. Generally, HBM memory can be implemented in a chip stack, where a bottom chip of the chip stack has exterior pads that conform to a given generation of a HBM specification. The chip stack can implement multiple HBM banks of memory, where each HBM bank corresponds to a respective channel. Multi-rank HBM can be implemented using one chip stack, two chip stacks, or more chip stacks. In multi-rank HBM, at least some exterior pads for two or more channels of HBM memory are connected together in parallel. For example, exterior pads for data signals of a channel are connected in parallel to equivalent or corresponding exterior pads for data signals of another channel. Generally, in some examples, connecting exterior pads in parallel connects multiple input or multiple input/output exterior pads that have a same functionality (e.g., a same input exterior pad or input/output exterior pad of different channels). The channels can be in a same chip stack or in different chip stacks, and hence, the corresponding exterior pads can be on a same bottom chip of a chip stack or on different bottom chips of different chip stacks. Further, in multi-rank HBM, at least some other exterior pads for each channel of HBM memory are uniquely connected (e.g., not connected in parallel with exterior pads for other channels). For example, one or more exterior pads for an enable signal (e.g., a clock enable signal) for each channel of HBM memory is uniquely connected.

An interface circuit of another chip, for example, in an electronic device is configured to implement multi-rank HBM. The interface circuit can include an input/output (I/O) circuit and a memory controller. The I/O circuit is connected to exterior pads of the chip. The number of the exterior pads connected to the I/O circuit corresponds with the number of parallel connections of exterior pads of the chip stack(s) of HBM memory and the number of unique connections to exterior pads of the chip(s) of HBM memory. The connections between the exterior pads of the chip and the exterior pads of the bottom chip(s) of the chip stack(s) of HBM memory can be in a substrate to which both the chip and bottom chip(s) are attached (e.g., by external connectors).

In some examples, higher capacity and increased depth of HBM memory can be achieved by implementing multi-rank HBM. In some examples, flexibility in using a chip having an interface that is configurable to implement multi-rank HBM can be achieved. Various additional aspects and benefits of examples are described in detail below.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed subject matter or as a limitation on the scope of the claimed subject matter. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

FIG. 1 illustrates an architecture for an electronic device according to some examples. In some examples, the electronic device can be a programmable device, while in other examples, the electronic device may not be programmable. In the illustrated example, the electronic device is a programmable device, and further includes a System-on-Chip (SoC) 100. The SoC 100 includes a plurality of subsystems, including a processing system (PS) 102, programmable logic region (PL) 104, hard block circuits (HB) 106, input/output circuits (I/O) 108, other IP circuits 110 (e.g., a system monitor or others), and a Network-on-Chip (NoC) 112. In some examples, each sub-system includes at least some component or circuit that is programmable, such as described herein. In some examples, some of the sub-systems can include a non-programmable application-specific circuit.

The PS 102 may be or include any of a variety of different processor types and number of processor cores. For example, the PS 102 may be implemented as an individual processor, e.g., a single core capable of executing program instruction code. In another example, the PS 102 may be implemented as a multi-core processor. The PS 102 may be implemented using any of a variety of different types of architectures. Example architectures that may be used to implement the PS 102 may include an ARM processor architecture, an x86 processor architecture, a graphics processing unit (GPU) architecture, a mobile processor architecture, a digital signal processor (DSP) architecture, or other suitable architecture that is capable of executing computer-readable program instruction code.

The PL 104 is logic circuitry that may be programmed or configured to perform specified functions. As an example, the PL 104 may be implemented as fabric of a field programmable gate array (FPGA). The PL 104 can include programmable logic elements including configurable logic blocks (CLBs), look-up tables (LUTs), random access memory blocks (BRAM), Ultra RAMs (URAMs), input/output blocks (IOBs), digital signal processing blocks (DSPs), clock managers, and/or delay lock loops (DLLs). In some architectures, the PL 104 includes columns of programmable logic elements, where each column includes a single type of programmable logic element (e.g., a column of CLBs, a column of BRAMs, etc.). The programmable logic elements can have one or more associated programmable interconnect elements. For example, in some architectures, the PL 104 includes a column of programmable interconnect elements associated with and neighboring each column of programmable logic elements. In such examples, each programmable interconnect element is connected to an associated programmable logic element in a neighboring column and is connected to neighboring programmable interconnect elements within the same column and the neighboring columns. The interconnected programmable interconnect elements can form a global interconnect network within the PL 104.

The PL 104 has an associated configuration frame interconnect (CF) 120. A configuration frame node residing on a controller (e.g., a platform management controller (PMC)) of the PS 102 is connected to the CF 120. The controller of the PS 102 sends configuration data to the configuration frame node, and the configuration frame node formats the configuration data in frames and transmits the frames through the CF 120 to the programmable logic elements and programmable interconnect elements. The configuration data may then be loaded into internal configuration memory cells of the programmable logic elements and programmable interconnect elements that define how the programmable elements are configured and operate. Any number of different sections or regions of PL 104 may be implemented in the SoC 100.

The HB 106 can be or include memory controllers (such as double data rate (DDR) memory controllers (e.g., for fourth generation DDR (DDR4), fifth generation DDR (DDR5), etc.), high bandwidth memory (HBM) memory controllers (e.g., for updated second generation of HBM (HBM2e), third generation of HBM (HBM3), etc.), or the like), peripheral component interconnect express (PCIe) blocks, Ethernet cores (such as a 100 Gbps (C=100) media address controller (CMAC), a multi-rate MAC (MRMAC), or the like), forward error correction (FEC) blocks, Analog-to-Digital Converters (ADC), Digital-to-Analog Converters (DAC), and/or any other hardened circuit. The I/O 108 can be implemented as High Performance Input/Output (HPIO), eXtreme DDR5 compatible Input/Output (X5IO), eXtreme Performance Input/Output (XPIO), High Density Input/Output (HDIO), Ultra-Dense Input/Output (UDIO), HBM input/output, multi-gigabit transceivers (MGTs), or any other input/output blocks. Any of the HB 106 and/or I/O 108 can be programmable.

The NoC 112 includes a programmable network 122 and a NoC peripheral interconnect (NPI) 124. The programmable network 122 communicatively couples subsystems and any other circuits of the SoC 100 together. The programmable network 122 includes NoC packet switches and interconnect lines connecting the NoC packet switches. Each NoC packet switch performs switching of NoC packets in the programmable network 122. The programmable network 122 has interface circuits at the edges of the programmable network 122. The interface circuits include NoC master units (NMUs) and NoC slave units (NSUs). Each NMU is an ingress circuit that connects a master circuit to the programmable network 122, and each NSU is an egress circuit that connects the programmable network 122 to a slave endpoint circuit. NMUs are communicatively coupled to NSUs via the NoC packet switches and interconnect lines of the programmable network 122. The NoC packet switches are connected to each other and to the NMUs and NSUs through the interconnect lines to implement a plurality of physical channels in the programmable network 122. The NoC packet switches, NMUs, and NSUs include register blocks that determine the operation of the respective NoC packet switch, NMU, or NSU.

A physical channel can also have one or more virtual channels. The virtual channels can implement weights to prioritize various communications along any physical channel. The NoC packet switches also support multiple virtual channels per physical channel. The programmable network 122 includes end-to-end Quality-of-Service (QoS) features for controlling data-flows therein. In examples, the programmable network 122 first separates data-flows into designated traffic classes. Data-flows in the same traffic class can either share or have independent virtual or physical transmission paths. The QoS scheme applies multiple levels of priority across traffic classes. Within and across traffic classes, the programmable network 122 applies a weighted arbitration scheme to shape the traffic flows and provide bandwidth and latency that meets the user requirements.

The NPI 124 includes circuitry to write to register blocks that determine the functionality of the NMUs, NSUs, and NoC packet switches. The NPI 124 includes a peripheral interconnect coupled to the register blocks for programming thereof to set functionality. The register blocks in the NMUs, NSUs, and NoC packet switches of the programmable network 122 support interrupts, QoS, error handling and reporting, transaction control, power management, and address mapping control. The NPI 124 includes an NPI root node residing on the controller of the PS 102, interconnected NPI switches connected to the NPI root node, and protocol blocks connected to the interconnected NPI switches and a corresponding register block.

To write to register blocks, a master circuit, such as the controller of the PS 102, sends configuration data to the NPI root node, and the NPI root node packetizes the configuration data into a memory mapped write request in a format implemented by the NPI 124. The NPI transmits the memory mapped write request to interconnected NPI switches, which route the request to a protocol block connected to the register block to which the request is directed. The protocol block can then translate the memory mapped write request into a format implemented by the register block and transmit the translated request to the register block for writing the configuration data to the register block.

The NPI 124 may be used to program any programmable boundary circuit of the SoC 100. For example, the NPI 124 may be used to program any HB 106 and/or I/O 108 that is programmable.

Various subsystems and circuits of the SoC 100 are communicatively coupled by various communication mechanisms. Some subsystems or circuits can be directly connected to others. As illustrated the I/O 108 is directly connected to the HB 106 and PL 104, and the HB 106 is further directly connected to the PL 104 and the PS 102. The PS 102, PL 104, HB 106, I/O 108, and other IP circuits 110 are communicatively coupled together via the programmable network 122 of the NoC 112.

In some examples, the SoC 100 can be communicatively coupled to other components. As illustrated, the SoC 100 is communicatively coupled to multi-rank HBM memory 130. The multi-rank HBM memory 130 can be one or more chip stacks, each including multiple memory chips. The one or more chip stacks can be included in a same package as the SoC 100, such as connected to a same organic interposer, a same semiconductor-based (e.g., silicon) interposer, a same wafer-level fan-out (WLFO), a same package substrate (e.g., an organic package substrate), or the like. The multi-rank HBM memory 130 is communicatively coupled to the I/O 108, which is connected to HB 106 (e.g., one or more memory controllers), the programmable network 122 of the NoC 112, and the PL 104. The HB 106 is connected to the PS 102 (e.g., the controller of the PS 102). Other memory can be communicatively connected to other I/O 108 and/or HB 106, such as dynamic random access memory (DRAM), flash memory, or the like.

Generally, the HB 106 and/or I/O 108 are configured to implement communications with the multi-rank HBM memory 130. In some examples, the HB 106 and I/O 108 are a HBM-generation-specific (HGS) memory controller and HGS I/O, respectively. In such examples, the HGS I/O can be connected to multiple HBM chip stacks, where, e.g., various exterior pads of the HBM chip stacks are connected in parallel. As examples, the HGS memory controller and HGS I/O can generally be implemented according to the HBM2e specification, the HBM3 specification, or the like. (It is noted that presently the HBM3 specification has not been ratified as final, and that any subsequent revisions to the specification can alter examples described herein.) In some examples, the HB 106 and I/O 108 are a non-HBM-generation-specific (nHGS) memory controller and a nHGS I/O, respectively. In such examples, the nHGS I/O can be HGS compatible and connected to one or more HBM chip stacks, where, e.g., various exterior pads for channels of the HBM chip stack(s) are connected in parallel. Additional details are described with respect to following figures.

Figure 2:
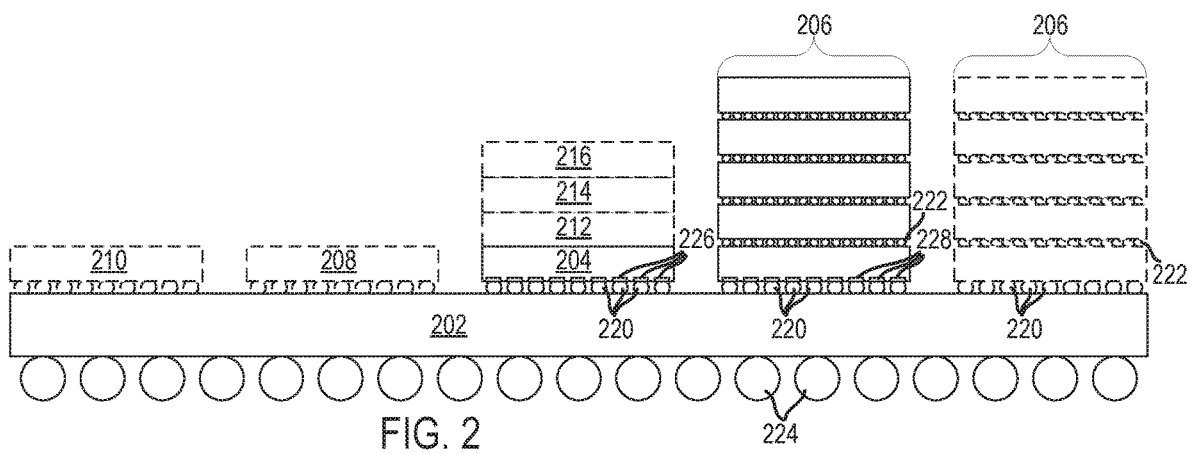
FIG. 2 depicts various implementations of an electronic device according to some examples.

The electronic device illustrated in FIG. 1 can be or can include a circuit like the SoC 100 implemented in a single monolithic integrated circuit (IC) chip, or implemented distributed across multiple IC chips. FIG. 2 illustrates various implementations of an electronic device. In some implementations, the electronic device includes one programmable IC chip 204 and one HBM chip stack 206, where the programmable IC chip 204 and a bottom IC chip of the HBM chip stack 206 are attached to a substrate 202. In such implementations, the SoC 100 can be implemented on the programmable IC chip 204, and the multi-rank HBM memory 130 can be implemented on the HBM chip stack 206.

In some implementations, the electronic device includes one programmable IC chip 204 and two HBM chip stacks 206, where the programmable IC chip 204 and respective bottom IC chips of the HBM chip stacks 206 are attached to a substrate 202. In such implementations, the SoC 100 can be implemented on the programmable IC chip 204, and the multi-rank HBM memory 130 can be implemented on the HBM chip stacks 206.

In some implementations, the electronic device includes multiple programmable IC chips (e.g., programmable IC chips 204, 208, 210) and one or more HBM chip stacks 206. The programmable IC chips and respective bottom IC chip(s) of the HBM chip stack(s) 206 are attached to a substrate 202. In such implementations, various subsystems of the SoC 100 can be implemented on different ones of the programmable IC chips. For example, the PS 102, HB 106, I/O 108, other IP circuits 110, and NoC 112 can be implemented on the programmable IC chip 204 (which may further include a PL 104), and a respective PL 104 can be implemented on the programmable IC chips 208, 210 (which may further include additional HB 106, I/O 108, other IP circuits 110, and/or portions of the NoC 112). The multi-rank HBM memory 130 can be implemented on the HBM chip stack(s) 206.

In some implementations, the electronic device includes a chip stack (e.g., an Active-on-Active (AoA) chip stack) including multiple programmable IC chips (e.g., programmable IC chips 204, 212, 214, 216) and one or more HBM chip stacks 206. The respective bottom IC chip of the AoA chip stack and HBM chip stack(s) 206 are attached to a substrate 202. In such implementations, various subsystems of the SoC 100 can be implemented on different ones of the programmable IC chips. For example, the PS 102, HB 106, I/O 108, other IP circuits 110, and NoC 112 can be implemented on the programmable IC chip 204 (which may further include a PL 104), and a respective PL 104 can be implemented on the programmable IC chips 212, 214, 216 (which may further include additional HB 106, other IP circuits 110, and/or portions of the NoC 112). The programmable IC chips can be stacked on each other, where neighboring chips are bonded (e.g., by hybrid oxide-to-oxide and metal-to-metal bonding) to each other or are attached to each other by external connectors (e.g., minibumps or microbumps). The multi-rank HBM memory 130 can be implemented on the HBM chip stack(s) 206.

The substrate 202 can be an organic interposer, a semiconductor-based (e.g., silicon-based) interposer, WLFO, a package substrate (e.g., an organic package substrate), or the like. External connectors 220 can attach respective IC chips to a first side of the substrate 202. The external connectors 220 can be, for example, copper pillars, microbumps, controlled collapse chip connection (C4) bumps, or the like. Depending on implementation, any and each of the programmable IC chips 204, 208, 210, and bottom IC chip of any HBM chip stack 206 is attached to a first side of the substrate 202 by external connectors 220. Exterior pads 226 are shown on the programmable IC chip 204. External connectors 220 are connected and attached to respective exterior pads 226, and the exterior pads 226 are connected to various circuits within the programmable IC chip 204. Exterior pads 228 are shown on the bottom IC chip of the HBM chip stack 206. External connectors 220 are connected and attached to respective exterior pads 228, and the exterior pads 228 are connected to various circuits within the HBM chip stack 206. A layout and/or a density of the exterior pads 228 of the HBM chip stack 206 can be according to a generation of a HBM specification. Some of the exterior pads 226 can be connected to one or more I/Os 108 on the programmable IC chip 204. The exterior pads 226 connected to one or more I/Os 108 can be arranged with a density that corresponds to or approximates the density of the exterior pads 228 of the HBM chip stack 206 in some examples. In other examples, the exterior pads 226 connected to one or more I/Os 108 can be arranged with a density that is less than (e.g., significantly less than) the density of the exterior pads 228 of the HBM chip stack 206. Although not illustrated, other IC chips connected to external connectors 220 may also have exterior pads to which the external connectors 220 are connected and attached.

Electrical connections are implemented between at least some exterior pads 226 of the programmable IC chip 204 and exterior pads 228 of the bottom chip(s) of the HBM chip stack(s) 206 through the substrate 202. Parallel connections and channel separate connections, as described in further detail below, can be implemented in the substrate 202 by metal lines and/or vias in the substrate 202, and can further include external connectors 220. A low resistance of the metal lines and/or vias in the substrate 202 (e.g., such as when the substrate 202 is an organic interposer) can enable low voltage and low drive signals for communicating through the substrate 202 between the programmable IC chip 204 and the HBM chip stack(s) 206.

External connectors 222 are implemented to attach IC chips in a HBM chip stack 206. The external connectors 222 can be, for example, minibumps or the like. External connectors 222 can be implemented to stack and attach any IC chips in any chip stack (e.g., HBM chip stack 206 and/or AoA chip stack). External connectors 224 are on a second side of substrate 202 opposite from the first side of the substrate 202. The external connectors 224 can be C4 bumps, ball grid array (BGA) balls, or the like, and may be implemented to attach the substrate 202 to a package substrate, a printed circuit board (PCB), or the like.

Currently, a semiconductor-based (e.g., silicon-based) interposer can be manufactured using the same types of tools and processes as the top metal traces on an IC chip (e.g., IC chips 204, etc.). The density of external connectors between an IC chip and the semiconductor-based interposer and the density of metal lines in the semiconductor-based interposer can each be greater than fifty times that of traditional organic package substrates. Traditional organic package substrate have been used to connect multiple chips in what has been referred to as a Multi-Chip Module (MCM).

Currently, between traditional organic package substrates and semiconductor-based interposers is a WLFO and organic interposer. Currently, the density of metal line connections between IC chips using WLFO and/or organic interposers is less that the density of metal line connections between IC chips using a semiconductor-based interposer. Also, the density of metal lines in the WLFO and/or organic interposer is less that the density of metal lines in a semiconductor-based interposer. Further, such densities of a WLFO and/or organic interposer are greater than the corresponding densities in a traditional organic package substrate. Metal lines in a WLFO and/or organic interposer can have a density that is about one-fifth of the density of metal lines in a semiconductor-based interposer.

In some traditional applications, density of connections between an IC chip and a semiconductor-based interposer and the density of metal lines in a semiconductor-based interposer saturated based on the line width/space limits of single pass non-numerically enhanced masks. These masks previously supported a line width/space of 0.4/0.4 µm and a pitch of 0.8 µm. It is contemplated that advances in technologies of processes of forming an organic interposer, a semiconductor-based interposer, a WLFO, and an organic package substrate can reduce pitches and spacings and can increase densities. It is projected that WLFO and organic package substrate technology may converge on metal line pitches and spacings equal to that of semiconductor-based interposers. Table 1 below shows the traditional metal line densities of a semiconductor-based interposer, a WLFO, and an organic package substrate.

TABLE 1

|  | (1) Traditional metal line pitch (mm) | (2) Minimum HBM metal line pitch (mm) | (3) Minimum 1000/mm pitch (mm) | (4) Projected future metal line pitch limit (mm) |
| --- | --- | --- | --- | --- |
| Organic Package Substrate | 0.075 | 0.01 | 0.004 | 0.02 |
| WLFO | 0.004 | 0.005 | 0.002 | 0.0008 |
| Semiconductor-based Interposer | 0.0008 | 0.005 | 0.002 | 0.0008 |

Table 1 above shows the minimum metal line pitch for the three identified IC chip interconnect methods. The column (1) is the traditional minimum limit of pitch between metal lines per metal line/metallization layer for each technology. Recently, processes for WLFO have started to move to incorporate aspects of photo lithography methods used in forming semiconductor-based interposers. It is contemplated that, in a few generations, organic interposers and WLFOs may have the same metal line density limits as semiconductor-based interposers. In a few generations, packages may generally have much higher metal line densities. In future generations, smaller packages may have more aggressive pitches, whereas larger packages (e.g., having >25 mm lateral edges) may have the traditional metal line pitch in Table 1. The column (4) in Table 1 is the projected future (e.g., in 5-10 years) minimum limit of pitch between metal lines and shows the dramatic change in metal line density predicted in 5-10 years. The column (2) in Table 1 shows minimum metal line pitches that HBM memories can use. Due to performance and signal integrity, HBM signals in some applications may not use the minimum metal line pitch possible. In Table 1, the traditional WLFO and semiconductor-based interposer can meet the metal line density needs of, e.g., 3 Gbps or greater (e.g., 3.6 Gbps or 6.4 Gbps) bandwidth HBM chip-to-chip signals.

The column (3) of Table 1 shows the minimum metal line pitch to achieve 1000 metal lines per mm. Signals on such metal lines could be static, asynchronous, single data rate (SDR), and/or double data rate (DDR). UDIO currently may be able to meet this requirement. UDIO can implement signals with a switching voltage aligned to chip core logic (e.g., in an FPGA implementation) voltage levels and with a minimum drive and drive standard programmability. The speed of these metal lines may be limited to 1 Gbps SDR due to impedance limitations. What these metal lines may lack in individual bandwidth is made up for in flexibility and numbers.

In a bandwidth comparison, a HBM interface offers 1712 physical metal lines of which approximately 170/mm are metal lines for data. The absolute bandwidth of HBM is 3 Gbps*1024=3 Tbps. The bandwidth of UDIO is 1 Gbps*1000=1000 Gbps/mm. Note the effective bandwidth of HBM is 170*3 Gbps=510 Gbps/mm. The effective bandwidth of UDIO may also be less. A semiconductor-based interposer exceeds the current implementation of UDIO. Traditional WLFO and organic package substrate may not be capable of implementing the UDIO metal line density requirement. In the future, WLFO and organic package substrate may be capable of meeting UDIO metal line density. WLFO and organic package substrate can increase density by increasing metal line/metallization layers.

Table 2 below shows the area and metal line density to escape various IO types.

TABLE 2

| I/O Type | (1) IO/mm² | (2) IO/mm | (3) Minimum 2 layer pitch (mm) | (4) Minimum 4 layer pitch (mm) |
| --- | --- | --- | --- | --- |
| (1) XPIO | 15.2 | 26.8 | 0.0747 | 0.1493 |
| (2) HPIO | 13.8 | 23.4 | 0.0854 | 0.1708 |
| (3) HDIO (7 nm node process) | 23.1 | 15.0 | 0.1334 | 0.2667 |
| (4) HDIO (16 nm node process) | 23.6 | 11.3 | 0.1763 | 0.3527 |
| (5) HBM2e I/O | 123.8 | 283.0 | 0.0140 | 0.028 |
| (6) HBM2e Stack | 245.6 | 283.0 | 0.0071 | 0.0141 |
| (7) UDIO Buffer | 18176.5 | 675.7 | 0.0030 | 0.0059 |
| (8) UDIO Bump | 556.0 | 1170.0 | 0.0017 | 0.0034 |

The HBM2e I/O row (5) is the metal line density to escape the I/O bump under, e.g., the programmable IC chip 204. HBM2e Stack row (6) is the metal line density required to escape the I/O bump under the bottom IC chip of the HBM chip stack 206 for a second generation HBM. The UDIO Buffer row (7) is the area of the buffer on, e.g., the programmable IC chip 204, and the metal line density to escape the metal lines perpendicular to the UDIO structure. The UDIO Bump row (8) is the area of the bumps including power and ground to escape the UDIO. In this case, the I/O are escaped parallel to the UDIO block.

I/Os, like XPIO and HPIO, can have many modes of operations, which are designed for off package connections. The densities are in alignment with traditional package technology, e.g., 0.075 mm metal line pitch for 2 metal line/metallization layer breakout. HDIO can have a higher area density relative to HPIO and XPIO, but HDIO may have a lower IO/mm density. XPIO, HPIO, and HDIO can be used for chip-to-chip connections.

Generally, a HBM chip stack can offer high bandwidth in a small area with lower power consumption than other memory technologies, such as DDR DRAM dual in-line memory module (DIMM) technology. For example, a HBM2e chip stack can have the same bandwidth as sixteen 64-bit DIMMs at a same data rate and as eight 64-bit DIMMs at twice the data rate. A HBM chip stack can have a fraction of the depth of a DDR-DIMM. For example, a channel of a HBM chip stack can be one-fourth to one-eighth of the capacity of a channel of a DDR-DIMM. Additionally, devices that were previously coupled with a HBM chip stack implemented I/O structures that were specific to the generation of the HBM chip stack to achieve the bandwidth of HBM and the specification (e.g., operating voltage) of the HBM. These I/O structures were static and unable to be used if not used with the specific HBM generation. Some examples described herein implement multi-rank HBM to achieve deeper HBM and/or more flexibility in the memory controller and/or I/O structures.

Various examples can be implemented consistent with any generation of HBM, such as HBM2e, HBM3, or another. Detailed examples described herein are described in the context of the HBM2e specification, and a person having ordinary skill in the art will readily understand the applicability of aspects of such examples to other generations of HBM, include the HBM3 specification.

A chip stack implementing HBM2e has 8 channels, with each channel having 214 exterior pads in the HBM2e chip stack interface. Table 3 below lists the signals and signal width (exterior pads in the HBM2e chip stack interface) for a single channel according to the HBM2e specification. The interface of the HBM2e chip stack, in total for 8 channels, has 1712 exterior pads.

TABLE 3

HBM2e Chip Stack Interface Per Channel

| Signal(s) | Directionality | Signal Width (Exterior Pads) |
|---|---|---|
| Data (Dq) | Input/output | 128 |
| Differential read data strobe (RDQS) | Output | 8 |
| Differential write data strobe (WDQS) | Input | 8 |
| Data mask (Dm) | Input/output | 16 |
| Data bus inversion (DBI) | Input/output | 16 |
| Data redundancy (Rd) | Input/output | 8 |
| Row redundancy (Rr) | Input | 1 |
| Column redundancy (Rc) | Input | 1 |
| Reserved | n/a | 2 |
| Parity (PAR) | Input/output | 4 |
| Column (C) | Input | 8 |
| Row (R) | Input | 6 |
| Differential clock (Ck_t/Ck_c) | Input | 2 |
| Data error (DERR) | Output | 4 |
| Address error (AERR) | Output | 1 |
| Clock enable (Cke) | Input | 1 |
| Total per channel | | 214 |
| Total for 8 channels | | 1712 |

It is worth noting that a chip stack implementing HBM3 has 32 channels, with each channel having 70 exterior pads in the HBM3 chip stack interface. The interface of the HBM3 chip stack, in total for 32 channels, has 2240 exterior pads.

According to some examples, various exterior pads of one or more HBM chip stacks can be connected in parallel together to implement a multi-rank HBM. Table 4 below shows which exterior pads for signals are capable of being connected in parallel across multiple channels, and which exterior pads for signals are to be unique (e.g., not connected in parallel) per channel according to some examples. A person having ordinary skill in the art will readily understand connectivity for other HBM generations, including HBM3.

TABLE 4

HBM2e Chip Stack Channel Connectivity

| Signal(s) | Signal Width (Exterior Pads) | |
|---|---|---|
| Dq | 128 | Capable of parallel connections for multiple channels |
| RDQS | 8 | Unique per channel |
| WDQS | 8 | Capable of parallel connections for multiple channels, or unique per channel |
| Dm | 16 | Capable of parallel connections for multiple channels |
| DBI | 16 | |
| Rd | 8 | |
| Rr | 1 | |
| Rc | 1 | |
| Reserved | 2 | |
| PAR | 4 | |
| C | 8 | |
| R | 6 | |
| Ck_t/Ck_c | 2 | |
| DERR | 4 | Unique per channel |
| AERR | 1 | |
| Cke | 1 | |

Generally, some signals can be communicated to a channel of a HBM chip stack where those signals do not target that channel. The clock enable signal (Cke) is unique for each channel and can enable or disable operation of the respective channel. Hence, although, e.g., a data signal (Dq), column address signal (C), and row address signal (R) are received at a channel of a HBM chip stack, whether the clock enable signal (Cke) is asserted determines whether the channel of the HBM chip stack operates on those signals.

In some examples, a chip having an interface circuit (e.g., including an I/O) can have a number of exterior pads connected to the interface circuit based on how the multi-rank HBM is to be implemented. Generally, the number of these exterior pads is equal to the number of different groups of parallel connected channels of HBM memory times the sum of (i) the number of signals that are capable of parallel connection for parallel connected channels and (ii) the number of signals per channel that are uniquely connected times the number of channels per group of parallel connected channels. This generalization assumes that each group of parallel connected channels has an equal number of parallel connected channels, and that the signals that are capable of parallel connection or are uniquely connected are the same for each channel and each group. The generalization can change if any assumption is not valid for any example. The generalization will be put further explained in the context of specific examples below.

In some examples, the chip having the interface circuit can have a reduced number of exterior pads connected to the interface circuit. If the interface circuit is configured to omit optional signals, corresponding exterior pads for those signals can likewise be omitted. Such signals can include data bus inversion signals (DBI) and data, row, and column redundancy signals (Rd, Rr, Rc). The interface circuit can also be configured to omit connections to unused or reserved for future use exterior pads of the HBM interface, and hence, corresponding exterior pads on the chip of the interface circuit can be omitted. Omitting such exterior pads can reduce a count of exterior pads and/or a density of exterior pads on the chip in some examples.

Figure 3:
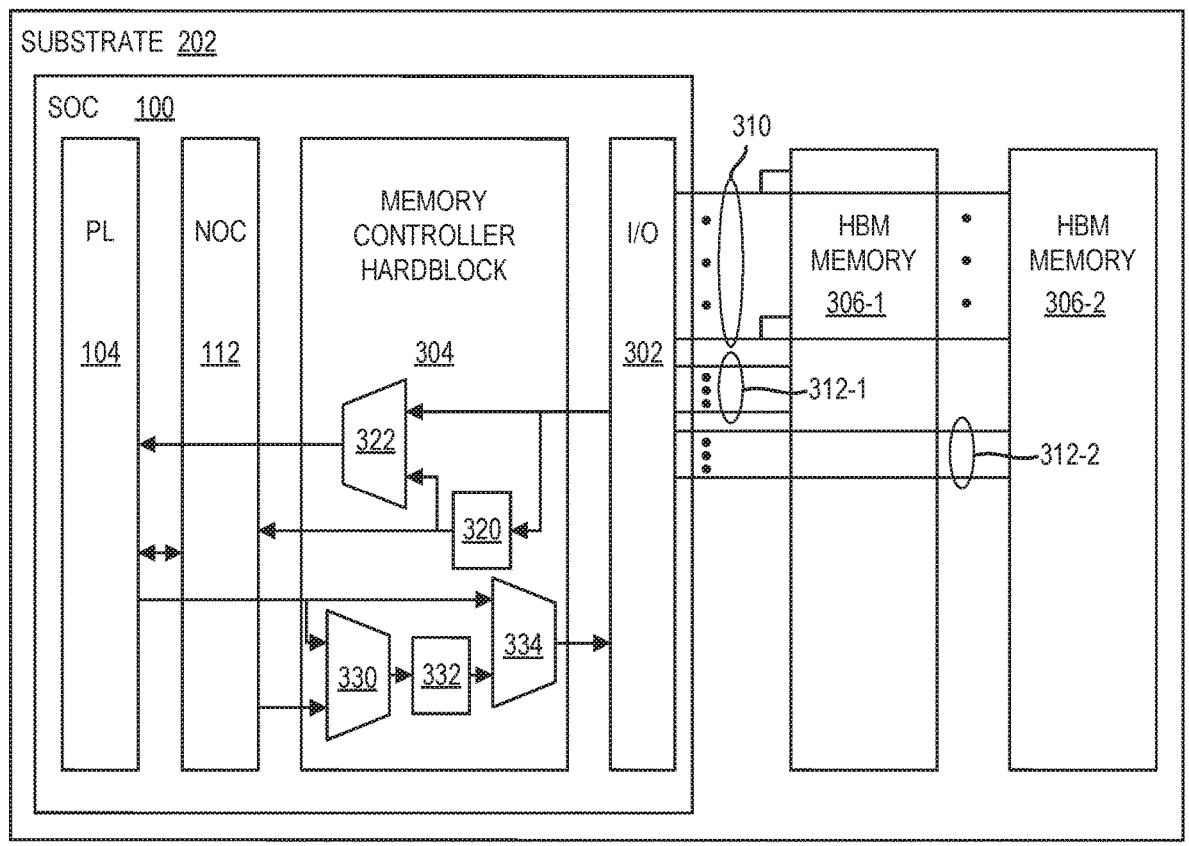
FIGS. 3 through 5 depict different electronic devices that each include a multi-rank high bandwidth memory (HBM) memory according to some examples.

FIG. 3 illustrates an electronic device including a multi-rank HBM memory according to some examples. The electronic device in this example includes the SoC 100 of FIG. 1, although various systems or circuits can be distributed across multiple IC chips as described above in other examples.

The SoC 100 includes a HGS I/O 302 and a HGS memory controller hardblock 304. The HGS I/O 302 and HGS memory controller hardblock 304 can be implemented in a single circuit or IP block or across multiple circuits or IP blocks. The HGS I/O 302 of the SoC 100 is communicatively coupled, via the substrate 202, to a first HBM chip stack and to a second HBM chip stack. The first HBM chip stack implements first HBM memory 306-1, and the second HBM chip stack implements second HBM memory 306-2. Each of the first HBM chip stack (e.g., first HBM memory 306-1) and the second HBM chip stack (e.g., second HBM memory 306-2) can have the interface for each of 8 channels of Table 3 when implementing the HBM2e specification. The first HBM chip stack and first HBM memory 306-1 may be used interchangeably herein, and the second HBM chip stack and second HBM memory 306-2 may be used interchangeably herein.

Generally, each channel of the first HBM memory 306-1 is connected in parallel with a corresponding channel of the second HBM memory 306-2. In this example, no channel within any HBM memory 306-1, 306-2 is connected in parallel with another channel within the same HBM memory 306-1, 306-2. Each HBM memory 306-1, 306-2 has 8 channels in this example according to the HBM2e specification. Hence, this example has 8 groups of parallel connected channels, and each of the 8 groups has 2 channels connected in parallel—one from HBM memory 306-1 and another one from HBM memory 306-2.

Parallel interconnections 310 are in the substrate 202 and can include metal lines and/or vias in the substrate 202. The parallel interconnections 310 connect exterior pads for a channel of the first HBM memory 306-1 to corresponding exterior pads for a channel of the second HBM memory 306-2, where signals for those exterior pads are capable of parallel connections for multiple channels. For example, exterior pads for data signals (Dq) for a channel 1 of the first HBM memory 306-1 are respectively connected to corresponding exterior pads for data signals (Dq) for a channel 1 of the second HBM memory 306-2 by parallel interconnections 310. The parallel interconnections 310 are further connected to the HGS I/O 302 (e.g., to respective exterior pads that are connected to the HGS I/O 302).

Channel separate interconnections 312-1, 312-2 are in the substrate 202 and can include metal lines and/or vias in the substrate 202. The channel separate interconnections 312-1 connect to exterior pads for signals for respective channels of the first HBM memory 306-1, where those signals are unique per channel. The channel separate interconnections 312-2 connect to exterior pads for signals for respective channels of the second HBM memory 306-2, where those signals are unique per channel. The channel separate interconnections 312-1, 312-2 are further connected to the HGS I/O 302 (e.g., to respective exterior pads that are connected to the HGS I/O 302). In some examples, the channel separate interconnections 312-1 include separate interconnections for differential read data strobe (RDQS), data error (DERR), address error (AERR), and clock enable signals (Cke) for each channel of the first HBM memory 306-1, and the channel separate interconnections 312-2 include separate interconnections for differential read data strobe (RDQS), data error (DERR), address error (AERR), and clock enable signals (Cke) for each channel of the second HBM memory 306-2.

Table 5 below lists signals for a HBM2e specification. Each of the HBM memories 306-1, 306-2 has a chip stack interface that conforms to the HBM2e specification. The two columns of Table 5 indicated by the first HBM memory 306-1 and the second HBM memory 306-2 indicate the number of interconnections to the respective HBM memory 306-1, 306-2 for a respective signal(s). A single merged cell in the two columns for a signal indicates that parallel interconnections 310 connect to exterior pads of the first HBM memory 306-1 and the second HBM memory 306-2 for the respective signal. Separate cells in the two columns for a signal indicate that channel separate interconnections 312-1 or 312-2 connect to exterior pads of the first HBM memory 306-1 or second HBM memory 306-2, respectively, for the respective signal. The column of Table 5 indicated by the HGS I/O 302 indicates the number of exterior pads on the chip that are attributable for a respective signal and connected to the interconnections and HGS I/O 302

TABLE 5

| Signal(s) | First HBM Memory 306-1 | Second HBM Memory 306-2 | HGS I/O 302 |
|---|---|---|---|
| Dq | 1024 (128 × 8) | | 1024 (128 × 8 × 1) |
| RDQS | 64 (8 × 8) | 64 (8 × 8) | 128 (8 × 8 × 2) |

TABLE 5-continued

| Signal(s) | First HBM Memory 306-1 | Second HBM Memory 306-2 | HGS I/O 302 |
|---|---|---|---|
| WDQS | 64 (8 × 8) | | 64 (8 × 8 × 1) |
| Dm | 128 (16 × 8) | | 128 (16 × 8 × 1) |
| DBI | 128 (16 × 8) | | 128 (16 × 8 × 1) (Optional) |
| Rd | 64 (8 × 8) | | 64 (8 × 8 × 1) (Optional) |
| Rr | 8 (1 × 8) | | 8 (1 × 8 × 1) (Optional) |
| Rc | 8 (1 × 8) | | 8 (1 × 8 × 1) (Optional) |
| Reserved | 16 (2 × 8) | | 16 (2 × 8 × 1) (Optional) |
| PAR | 32 (4 × 8) | | 32 (4 × 8 × 1) |
| C | 64 (8 × 8) | | 64 (8 × 8 × 1) |
| R | 48 (6 × 8) | | 48 (6 × 8 × 1) |
| Ck_t/Ck_c | 16 (2 × 8) | | 16 (2 × 8 × 1) |
| DERR | 32 (4 × 8) | 32 (4 × 8) | 64 (4 × 8 × 2) |
| AERR | 8 (1 × 8) | 8 (1 × 8) | 16 (1 × 8 × 2) |
| Cke | 8 (1 × 8) | 8 (1 × 8) | 16 (1 × 8 × 2) |
| Total | | | 1824 |

Table 5 shows that 1024 parallel interconnections 310 connect to the exterior pads for data signals (Dq) for 8 channels of the first HBM memory 306-1 and the second HBM memory 306-2, and connect to 1024 exterior pads connected to the HGS I/O 302. Parallel interconnections 310 are connected to exterior pads for different signals for 8 channels of the first HBM memory 306-1 and the second HBM memory 306-2, and to exterior pads connected to the HGS I/O 302. Those signals include the differential write data strobe (WDQS, which can include differential write data strobe signals Wdqs_t/Wdqs_c), data mask signals (Dm), data bus inversion (DBI), data, row, and column redundancy signals (Rd, Rr, Rc), reserved for future use (Reserved), parity signals (PAR), column address signals (C), row address signals (R), and differential clock signals (Ck_t/Ck_c).

Table 5 further shows that channel separate interconnections 312-1 connect to the exterior pads for differential read data strobe (RDQS, which can include differential read data strobe signals Rdqs_t/Rdqs_c), data error signals (DERR), address error signals (AERR), and clock enable signals (Cke) for 8 channels of the first HBM memory 306-1, and shows that channel separate interconnections 312-2 connect to the exterior pads for differential read data strobe (RDQS), data error signals (DERR), address error signals (AERR), and clock enable signals (Cke) for 8 channels of the second HBM memory 306-2. 128 total channel separate interconnections 312 are implemented for differential read data strobe (RDQS) (e.g., 8 interconnections for each of 8 channels of each of the 2 HBM memories). 64 total channel separate interconnections 312 are implemented for data error signals (DERR) (e.g., 4 interconnections for each of 8 channels of each of the 2 HBM memories). 16 total channel separate interconnections 312 are implemented for address error signals (AERR) (e.g., 1 interconnection for each of 8 channels of each of the 2 HBM memories). 16 total channel separate interconnections 312 are implemented for clock enable signals (Cke) (e.g., 1 interconnection for each of 8 channels of each of the 2 HBM memories). These channel separate interconnections 312 connect to 224 exterior pads (e.g., 128, 64, 16, and 16 for RDQS, DERR, AERR, and Cke, respectively) connected to the HGS I/O 302. Of these 224 exterior pads, 112 may be used for one rank, while the remaining 112 are for a second rank.

Relating the generalization above to this example, there are 8 groups of parallel connected channels, 2 channels connected in parallel per group, 200 signals per channel (all signals except RDQS, DERR, AERR, and Cke) that are connected in parallel, and 14 signals per channel (RDQS, DERR, AERR, and Cke) that are uniquely connected. Hence, 8×[200+(14×2)]=1824.

Further, in this example, the HGS I/O 302 is connected to 1024 (or 128×8×1) exterior pads for data (Dq) input/output and 16 (or 1×8×2) for clock enable (Cke) output. With 128 exterior pads for data signals (Dq) per channel, the 1024 exterior pads for data (Dq) input/output is an 8×1 multiple of the number of exterior pads for data signals (Dq) per channel. With 1 exterior pad for a clock enable signal (Cke) per channel, the 16 exterior pads for clock enable (Cke) input/output is an 8×2 multiple of the number of exterior pads for a clock enable signal (Cke) per channel. For a given number of groups of channels connected in parallel, the numbers of exterior pads for clock enable (Cke) output, or more generally, the number of exterior pads for signals that are uniquely connected, can increase as a function of the number of channels connected in parallel per group. Further, for a given number of groups of channels connected in parallel, the numbers of exterior pads for data (Dq) input/output, or more generally, the number of exterior pads for signals that are capable of being connected in parallel, can remain the same regardless of the number of channels connected in parallel per group. In the illustrated example, with two channels being connected in parallel in each group, the 8×2 multiples indicated above for the exterior pads for the clock enable (Cke) output is two (e.g., the number of channels connected in parallel in a group) times the 8×1 multiple for the exterior pads for the data (Dq) input/output.

The HGS I/O 302 can include circuitry that is configured to operate according to a specific generation of a HBM specification. For example, the HGS I/O 302 can include a physical layer (PHY) that includes drivers (e.g., buffers) and receivers that are configured to implement defined respective ranges of voltage, drive current, latency, frequency, etc. at each HBM memory 306-1, 306-2 to which the HGS I/O 302 is connected. The HGS I/O 302 can further include circuitry that is configured to serialize/deserialize data for transmission to or upon receipt from a HBM memory 306-1, 306-2. For example, parallel data received at the HGS I/O 302 from, e.g., the PL 104 or NoC 112 at a first frequency can be serialized and output to the HBM memory 306-1, 306-2 at a second frequency greater than the first frequency. Conversely, serial data received at the HGS I/O 302 from a HBM memory 306-1, 306-2 at a third frequency can be deserialized and output to, e.g., the PL 104 or NoC 112 at a fourth frequency less than the third frequency.

The HGS memory controller hardblock 304 can be configured to selectively be in a bypass mode. The HGS memory controller hardblock 304 includes processing circuits 320, 332 and multiplexers 322, 330, 334. An input node of the HGS memory controller hardblock 304 connected to an output node of the HGS I/O 302 is connected to respective input nodes of the processing circuit 320 and the multiplexer 322. An output node of the processing circuit 320 is connected to another input node of the multiplexer 322 and to an input node of the NoC 112 (e.g., programmable network 122). An output node of the multiplexer 322 is connected to an input node of the PL 104. Raw data received by the HGS memory controller hardblock 304 from the HGS I/O 302 is provided to the multiplexer 322 and to the processing circuit 320. The processing circuit 320 can process the raw data and output processed data to the multiplexer 322 and to the NoC 112. The multiplexer 322 selectively transmits the raw data to the PL 104 when the HGS memory controller hardblock 304 is configured in the bypass mode and selectively transmits the processed data to the PL 104 when the HGS memory controller hardblock 304 is configured to not be in the bypass mode. In a bypass mode, a memory controller (e.g., a soft IP core) can be instantiated in the PL 104, for example.

An input node of the HGS memory controller hardblock 304 connected to an output node of the NoC 112 (e.g., programmable network 122) is connected to an input node of the multiplexer 330. Another input node of the HGS memory controller hardblock 304 connected to an output node of the PL 104 is connected to respective input nodes of the multiplexers 330, 334. An output node of the multiplexer 330 is connected to an input node of the processing circuit 332. An output node of the processing circuit 332 is connected to another input node of the multiplexer 334. An output node of the multiplexer 334 is connected to an input node of the HGS I/O 302. First raw data received by the HGS memory controller hardblock 304 from the NoC 112 is provided to the multiplexer 330. Second raw data received by the HGS memory controller hardblock 304 from the PL 104 is provided to the multiplexers 330, 334. The multiplexer 330 is configured to selectively transmit the first raw data or the second raw data to the processing circuit 332. The processing circuit 332 can process the first or second raw data provided to the processing circuit 332 and output processed data to the multiplexer 334. The multiplexer 334 selectively transmits the first raw data to the HGS I/O 302 when the HGS memory controller hardblock 304 is configured in the bypass mode and selectively transmits the processed data to the HGS I/O 302 when the HGS memory controller hardblock 304 is configured to not be in the bypass mode. In a bypass mode, a memory controller can be instantiated in the PL 104, for example.

The HGS memory controller hardblock 304 (e.g., processing circuit 320) and/or the PL 104, whichever is implementing the memory controller for the multi-rank HBM memory (e.g., whether the SoC 100 is in bypass mode), can process the differential read data strobe (RDQS). The memory controller (e.g., processing circuit 320 and/or logic instantiated on the PL 104) logically ORs the differential read data strobe signals Rdqs_t received from each of the corresponding channel separate interconnections 312 to create a multi-rank differential read data strobe signal Rdqs_t, and logically ANDs the differential read data strobe signals Rdqs_c received from each of the corresponding channel separate interconnections 312 to create a multi-rank differential read data strobe signal Rdqs_c.

As illustrated by Table 5 for HBM2e, 1824 exterior pads connected to the HGS I/O 302 can be on an IC chip to implement a multi-rank HBM of two HBM memories 306-1, 306-2. The number of exterior pads connected to the HGS I/O 302 can be reduced by omitting exterior pads for optional signals, like for data bus inversion signals (DBI) and data, row, and column redundancy signals (Rd, Rr, Rc), and/or exterior pads that are unused or reserved for future use (Reserved). Omitting these exterior pads can result in 224 less exterior pads being implemented connected to the HGS I/O 302, although any combination or permutation of omitting any of the pads can be implemented, which may result in a smaller reduction. As examples, 1696 (omitting exterior pads for data bus inversion signals (DBI)), 1616 (omitting exterior pads for DBI and data, row, and column redundancy signals (Rd, Rr, Rc)), or 1600 (omitting exterior pads for DBI, Rd, Rr, and Rc, and unused exterior pads (Reserved)) exterior pads connected to the HGS I/O 302 can be on an IC chip to implement a multi-rank HBM of two HBM memories 306-1, 306-2. In some examples, the number of exterior pads required to be implemented with the HGS I/O 302 can be less than the standard 1712 used for previous HBM implementations, which can allow for multi-rank HBM without increasing the number of I/O exterior pads and connections in the HGS I/O 302.

The number of exterior pads connected to the HGS I/O 302 and/or respective numbers of interconnections can further vary depending on the number of HBM memories connected together in the multi-rank HBM and/or the generation of the HBM specification that is implemented. Any number of HBM memories can be implemented. The parallel interconnections 310 can further be connected to the additional HBM memories, and different respective channel separate interconnections can be added for each channel of the additional HBM memories. Accordingly, the number of exterior pads connected to the HGS I/O 302 can increase based on the additional channel separate interconnections that are implemented for the additional HBM memories. In some examples, the number of exterior pads connected to the HGS I/O 302 can be equal to or less than 1712 exterior pads by omitting exterior pads for optional signals and unused exterior pads and by connecting three channels of HBM memories in parallel according to the pattern shown in Table 5. In such an example connecting three channels of HBM memories in parallel, 1712 exterior pads are implemented, with 1376 exterior pads being implemented for parallel interconnections as indicated by Table 5, and 336 exterior pads being implemented for channel separate interconnections. Further, different generations of HBM can implement different signals and/or numbers of signals, which can result in a different number of exterior pads connected to the HGS I/O 302 and/or different numbers of interconnections being implemented.

In further examples, signals described above in the context of Table 5 being implemented on parallel interconnections 310 can be implemented on channel separate interconnections 312. For example, the differential write data strobe (WDQS) can be implemented on channel separate interconnections 312, which can result in an increase in exterior pads connected to the HGS I/O 302. Table 6 below illustrates such an implementation. A person having ordinary skill in the art will readily understand Table 6 in view of the preceding description of Table 5.

TABLE 6

| Signal(s) | First HBM Memory 306-1 | Second HBM Memory 306-2 | HGS I/O 302 |
|---|---|---|---|
| Dq | 1024 (128 × 8) | | 1024 (128 × 8 × 1) |
| RDQS | 64 (8 × 8) | 64 (8 × 8) | 128 (8 × 8 × 2) |
| WDQS | 64 (8 × 8) | 64 (8 × 8) | 128 (8 × 8 × 2) |
| Dm | 128 (16 × 8) | | 128 (16 × 8 × 1) |
| DBI | 128 (16 × 8) | | 128 (16 × 8 × 1) (Optional) |
| Rd | 64 (8 × 8) | | 64 (8 × 8 × 1) (Optional) |
| Rr | 8 (1 × 8) | | 8 (1 × 8 × 1) (Optional) |
| Rc | 8 (1 × 8) | | 8 (1 × 8 × 1) (Optional) |
| Reserved | 16 (2 × 8) | | 16 (2 × 8 × 1) (Optional) |
| PAR | 32 (4 × 8) | | 32 (4 × 8 × 1) |
| C | 64 (8 × 8) | | 64 (8 × 8 × 1) |
| R | 48 (6 × 8) | | 48 (6 × 8 × 1) |
| Ck_t/Ck_c | 16 (2 × 8) | | 16 (2 × 8 × 1) |
| DERR | 32 (4 × 8) | 32 (4 × 8) | 64 (4 × 8 × 2) |
| AERR | 8 (1 × 8) | 8 (1 × 8) | 16 (1 × 8 × 2) |
| Cke | 8 (1 × 8) | 8 (1 × 8) | 16 (1 × 8 × 2) |
| Total | | | 1888 |

In the above-described examples in the context of FIG. 3, the exterior pads connected to the HGS I/O 302 can be arranged with a density that corresponds to or approximates the density of the exterior pads of the HBM memory 306-1 or 306-2, which may be according to the corresponding generation of a HBM specification.

The above-described examples in the context of FIG. 3 can implement multi-rank HBM that is deeper and has a higher capacity than a single HBM memory. For example, with HBM2e, a single HBM memory has 8 channels, whereas multi-rank HBM described herein can have, e.g., 16 channels (2 HBM memories), 24 channels (3 HBM memories), 32 channels (4 HBM memories), etc.

Figure 4:
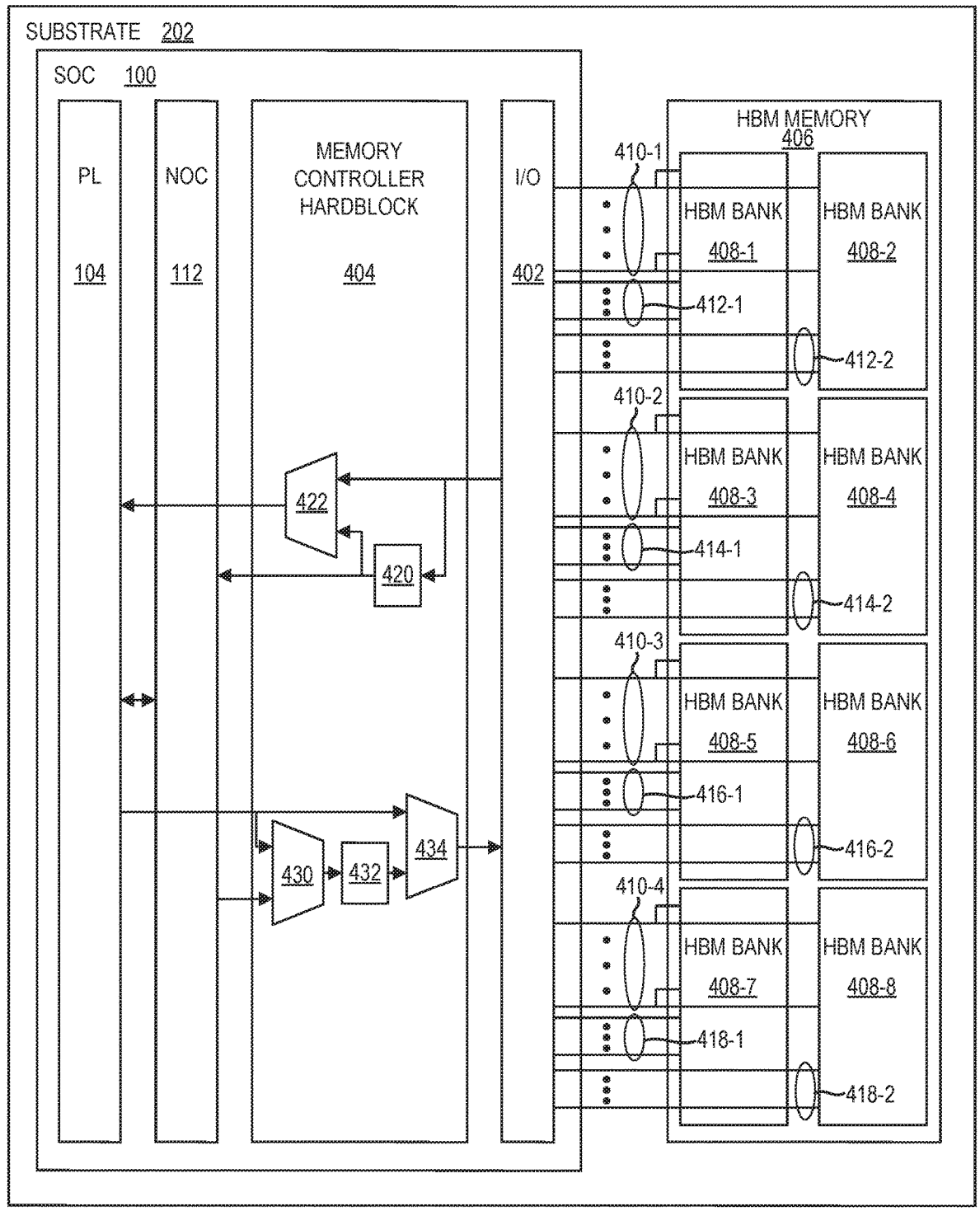

FIG. 4 illustrates an electronic device including a multi-rank HBM memory according to some examples. The electronic device in this example includes the SoC 100 of FIG. 1, although various systems or circuits can be distributed across multiple IC chips as described above in other examples.

The SoC 100 includes a nHGS I/O 402 and a nHGS memory controller hardblock 404. The nHGS I/O 402 and nHGS memory controller hardblock 404 can be implemented in a single circuit or IP block or across multiple circuits or IP blocks. The nHGS I/O 402 of the SoC 100 is HGS-compatible. The nHGS I/O 402 of the SoC 100 is communicatively coupled, via the substrate 202, to a HBM chip stack that implements HBM memory 406. The HBM chip stack (e.g., HBM memory 406) can have the interface for each of 8 channels of Table 3 when implementing the HBM2e specification. The HBM chip stack and HBM memory 406 may be used interchangeably herein. The HBM memory 406 includes HBM banks 408-1, 408-2, 408-3, 408-4, 408-5, 408-6, 408-7, 408-8, each of which implements a respective channel of the HBM memory 406. Various aspects of channels, banks, and connections illustrated in FIG. 4 and described here may be applicable, and further clarify, aspects of FIG. 3.

Generally, two channels of the HBM memory 406 are connected together in parallel. In this example, no channel within the HBM memory 406 is connected in parallel with a channel within another HBM memory. As indicated, the HBM memory 406 has 8 channels in this example according to the HBM2e specification. Hence, this example has 4 groups of parallel connected channels, and each of the 4 groups has 2 channels connected in parallel.

Parallel interconnections 410-1, 410-2, 410-3, 410-4 are in the substrate 202 and can include metal lines and/or vias in the substrate 202. The parallel interconnections 410 generally connect two channels (e.g., two HBM banks 408) in parallel. The parallel interconnections 410-1 connect exterior pads for the HBM bank 408-1 to corresponding exterior pads for the HBM bank 408-2, where signals for those exterior pads are capable of parallel connections for multiple channels. The parallel interconnections 410-2 connect exterior pads for the HBM bank 408-3 to corresponding exterior pads for the HBM bank 408-4, where signals for those exterior pads are capable of parallel connections for multiple channels. The parallel interconnections 410-3 connect exterior pads for the HBM bank 408-5 to corresponding exterior pads for the HBM bank 408-6, where signals for those exterior pads are capable of parallel connections for multiple channels. The parallel interconnections 410-4 connect exterior pads for the HBM bank 408-7 to corresponding exterior pads for the HBM bank 408-8, where signals for those exterior pads are capable of parallel connections for multiple channels. For example, exterior pads for data signals (Dq) for a channel 1 (e.g., HBM bank 408-1) of the HBM memory 406 are respectively connected to corresponding exterior pads for data signals (Dq) for a channel 2 (e.g., HBM bank 408-2) of the HBM memory 406 by parallel interconnections 410-1. The parallel interconnections 410 are further connected to the nHGS I/O 402 (e.g., to respective exterior pads that are connected to the nHGS I/O 402).

Channel separate interconnections 412-1, 412-2, 414-1, 414-2, 416-1, 416-2, 418-1, 418-2 are in the substrate 202 and can include metal lines and/or vias in the substrate 202. The channel separate interconnections 412-1 connect to exterior pads for signals for the HBM bank 408-1, where those signals are unique per channel. The channel separate interconnections 412-2 connect to exterior pads for signals for the HBM bank 408-2, where those signals are unique per channel. The channel separate interconnections 414-1 connect to exterior pads for signals for the HBM bank 408-3, where those signals are unique per channel. The channel separate interconnections 414-2 connect to exterior pads for signals for the HBM bank 408-4, where those signals are unique per channel. The channel separate interconnections 416-1 connect to exterior pads for signals for the HBM bank 408-5, where those signals are unique per channel. The channel separate interconnections 416-2 connect to exterior pads for signals for the HBM bank 408-6, where those signals are unique per channel. The channel separate interconnections 418-1 connect to exterior pads for signals for the HBM bank 408-7, where those signals are unique per channel. The channel separate interconnections 418-2 connect to exterior pads for signals for the HBM bank 408-8, where those signals are unique per channel. The channel separate interconnections 412, 414, 416, 418 are further connected to the nHGS I/O 402 (e.g., to respective exterior pads that are connected to the nHGS I/O 402). In some examples, the channel separate interconnections 412, 414, 416, 418 include separate interconnections for clock enable signals (Cke) for the respective HBM bank 408-1 through 408-8 of the HBM memory 406.

Table 7 below lists signals for a HBM2e specification. The HBM memory 406 has a chip stack interface that conforms to the HBM2e specification. The eight columns of Table 7 indicated by the 8 channels of the HBM memory 406 indicate the number of interconnections to the respective channels for a respective signal. A single merged cell in two columns for different channels for a signal indicates that parallel interconnections 410 connect to exterior pads of the two respective HBM banks 408 for the respective signal. A separate cell in one column for a signal indicates that channel separate interconnections 412, 414, 416, or 418 connect to exterior pads of the respective HBM bank 408 for the respective signal. The column of Table 7 indicated by the nHGS I/O 402 indicates the number of exterior pads on the chip that are attributable for a respective signal and connected to the interconnections and nHGS I/O 402.

TABLE 7

| Signal(s) | HBM Memory 406 | | | | | | | | nHGS I/O 402 |
|---|---|---|---|---|---|---|---|---|---|
| | Ch. 1 408-1 | Ch. 2 408-2 | Ch. 3 408-3 | Ch. 4 408-4 | Ch. 5 408-5 | Ch. 6 408-6 | Ch. 7 408-7 | Ch. 8 408-8 | |
| Dq | 128 | | 128 | | 128 | | 128 | | 512 |
| RDQS | 8 | 8 | 8 | 8 | 8 | 8 | 8 | 8 | 64 |
| WDQS | 8 | | 8 | | 8 | | 8 | | 32 |
| Dm | 16 | | 16 | | 16 | | 16 | | 64 |
| DBI | 16 | | 16 | | 16 | | 16 | | 64 |
| Rd | 8 | | 8 | | 8 | | 8 | | 32 |
| Rr | 1 | | 1 | | 1 | | 1 | | 4 |
| Rc | 1 | | 1 | | 1 | | 1 | | 4 |
| Reserved | 2 | | 2 | | 2 | | 2 | | 8 |
| PAR | 4 | | 4 | | 4 | | 4 | | 16 |
| C | 8 | | 8 | | 8 | | 8 | | 32 |
| R | 6 | | 6 | | 6 | | 6 | | 24 |
| Ck_t/Ck_c | 2 | | 2 | | 2 | | 2 | | 8 |
| DERR | 4 | 4 | 4 | 4 | 4 | 4 | 4 | 4 | 32 |
| AERR | 1 | 1 | 1 | 1 | 1 | 1 | 1 | 1 | 8 |
| Cke | 1 | 1 | 1 | 1 | 1 | 1 | 1 | 1 | 8 |
| Total | | | | | | | | | 912 |

Table 7 shows that 128 parallel interconnections 410-1 connect to the exterior pads for data signals (Dq) for HBM bank 408-1 (channel 1) and the HBM bank 408-2 (channel 2); 128 parallel interconnections 410-2 connect to the exterior pads for data signals (Dq) for HBM bank 408-3 (channel 3) and the HBM bank 408-4 (channel 4); 128 parallel interconnections 410-3 connect to the exterior pads for data signals (Dq) for HBM bank 408-5 (channel 5) and the HBM bank 408-6 (channel 6); and 128 parallel interconnections 410-4 connect to the exterior pads for data signals (Dq) for HBM bank 408-7 (channel 7) and the HBM bank 408-8 (channel 8). Additionally, Table 7 shows that these parallel interconnections 410 for the data signals (Dq) connect to 512 exterior pads connected to the nHGS I/O 402. Parallel interconnections 410 are connected to exterior pads for different signals of the respective HBM banks 408, and to exterior pads connected to the nHGS I/O 402. Those signals include the differential write data strobe (WDQS), data mask signals (Dm), data bus inversion (DBI), data, row, and column redundancy signals (Rd, Rr, Rc), reserved for future use (Reserved), parity signals (PAR), column address signals (C), row address signals (R), and differential clock signals (Ck_t/Ck_c).

Table 7 further shows that channel separate interconnections 412, 414, 416, or 418 connect to the exterior pads for differential read data strobe (RDQS), data error signals (DERR), address error signals (AERR), and clock enable signals (Cke) for each HBM bank 408 for respective channels 1 through 8. Channel separate interconnections 412-1 connect to the exterior pads for RDQS, DERR, AERR, and Cke for HBM bank 408-1. Channel separate interconnections 412-2 connect to the exterior pads for RDQS, DERR, AERR, and Cke for HBM bank 408-2. Channel separate interconnections 414-1 connect to the exterior pads for RDQS, DERR, AERR, and Cke for HBM bank 408-3. Channel separate interconnections 414-2 connect to the exterior pads for RDQS, DERR, AERR, and Cke for HBM bank 408-4. Channel separate interconnections 416-1 connect to the exterior pads for RDQS, DERR, AERR, and Cke for HBM bank 408-5. Channel separate interconnections 416-2 connect to the exterior pads for RDQS, DERR, AERR, and Cke for HBM bank 408-6. Channel separate interconnections 418-1 connect to the exterior pads for RDQS, DERR, AERR, and Cke for HBM bank 408-7. Channel separate interconnections 418-2 connect to the exterior pads for RDQS, DERR, AERR, and Cke for HBM bank 408-8. These channel separate interconnections 412, 414, 416, 418 connect to 112 exterior pads (e.g., 64, 32, 8, and 8 for RDQS, DERR, AERR, and Cke, respectively) connected to the nHGS I/O 402.

Relating the generalization above to this example, there are 4 groups of parallel connected channels, 2 channels connected in parallel per group, 200 signals per channel (all signals except RDQS, DERR, AERR, and Cke) that are connected in parallel, and 14 signals per channel (RDQS, DERR, AERR, and Cke) that are uniquely connected. Hence, 4×[200+(14×2)]=912.

Further, in this example, the nHGS I/O 402 is connected to 512 (or 128×4×1) exterior pads for data (Dq) input/output and 8 (or 1×4×2) for clock enable (Cke) output. With 128 exterior pads for data signals (Dq) per channel, the 512 exterior pads for data (Dq) input/output is a 4×1 multiple of the number of exterior pads for data signals (Dq) per channel. With 1 exterior pad for a clock enable signal (Cke) per channel, the 8 exterior pads for clock enable (Cke) input/output is a 4×2 multiple of the number of exterior pads for a clock enable signal (Cke) per channel. For a given number of groups of channels connected in parallel, the numbers of exterior pads for clock enable (Cke) output, or more generally, the number of exterior pads for signals that are uniquely connected, can increase as a function of the number of channels connected in parallel per group. Further, for a given number of groups of channels connected in parallel, the numbers of exterior pads for data (Dq) input/output, or more generally, the number of exterior pads for signals that are capable of being connected in parallel, can remain the same regardless of the number of channels connected in parallel per group. In the illustrated example, with two channels being connected in parallel in each group, the 4×2 multiples indicated above for the exterior pads for the clock enable (Cke) output is two (e.g., the number of channels connected in parallel in a group) times the 4×1 multiple for the exterior pads for the data (Dq) input/output.

The nHGS I/O 402 can include circuitry that is configured to operate according to a technology other than a HBM specification. The nHGS I/O 402 can be programmable. For example, the nHGS I/O 402 can include a physical layer (PHY) that includes drivers (e.g., buffers) and receivers that are configurable to implement different respective ranges of voltage, drive current, latency, frequency, etc. The PHY layer can be configurable to operate with non-HBM memory, such as being configurable to operate with DDR4, DDR5, or the like memory. The nHGS I/O 402 can further include circuitry that is configured to serialize/deserialize data for transmission to or upon receipt from HBM memory 406 or other memory, like described above with respect to FIG. 3.

The nHGS memory controller hardblock 404 can be configured to selectively be in a bypass mode. The nHGS memory controller hardblock 404 includes processing circuits 420, 432 and multiplexers 422, 430, 434. The processing circuits 420, 432 and multiplexers 422, 430, 434 are connected and operate in bypass mode like the processing circuits 320, 332 and multiplexers 322, 330, 334 described above with respect to FIG. 3. The processing circuits 320, 332 can be programmable to process raw data according to, e.g., different technology specifications, such as DDR4, DDR5, HBM2e, HBM3, or the like.

As illustrated by Table 7 for HBM2e, 912 exterior pads connected to the nHGS I/O 402 can be on an IC chip to implement a multi-rank HBM, where each channel of a HBM memory 406 is connected in parallel with one other channel of the HBM memory 406. The number of exterior pads connected to the nHGS I/O 402 can be reduced by omitting exterior pads for optional signals, like for data bus inversion signals (DBI) and data, row, and column redundancy signals (Rd, Rr, Rc), and/or exterior pads that are unused or reserved for future use (Reserved). Omitting these exterior pads can result in 112 less exterior pads being implemented connected to the nHGS I/O 402, although any combination or permutation of omitting any of the pads can be implemented, which may result in a smaller reduction. As examples, 848 (omitting exterior pads for data bus inversion signals (DBI)), 808 (omitting exterior pads for DBI and data, row, and column redundancy signals (Rd, Rr, Rc)), or 800 (omitting exterior pads for DBI, Rd, Rr, and Rc, and unused exterior pads (Reserved)) exterior pads connected to the nHGS I/O 402 can be on an IC chip to implement a multi-rank HBM, where each channel of a HBM memory 406 is connected in parallel with one other channel of the HBM memory 406. In some examples, the number of exterior pads required to be implemented with the nHGS I/O 402 can be less than the standard 1712 used for previous HBM implementations.

The number of exterior pads connected to the nHGS I/O 402 and/or respective numbers of interconnections can further vary depending on the number of channels of a HBM memory connected in parallel (as illustrated by subsequent description), the number of HBM memories connected together in the multi-rank HBM, and/or the generation of the HBM specification that is implemented. Any number of HBM memories can be implemented. The parallel interconnections 410 can further be connected to the additional HBM memories, and different respective channel separate interconnections can be added for each channel of the additional HBM memories. Accordingly, the number of exterior pads connected to the nHGS I/O 402 can increase based on the additional channel separate interconnections that are implemented for the additional HBM memories. Further, different generations of HBM can implement different signals and/or numbers of signals, which can result in a different number of exterior pads connected to the nHGS I/O 402 and/or different numbers of interconnections being implemented.

In further examples, signals described above in the context of Table 7 being implemented on parallel interconnections 410 can be implemented on channel separate interconnections 412, 414, 416, 418. For example, the differential write data strobe (WDQS) can be implemented on channel separate interconnections 412, 414, 416, 418, which can result in an increase in exterior pads connected to the nHGS I/O 402. Table 8 below illustrates such an implementation. A person having ordinary skill in the art will readily understand Table 8 in view of the preceding description of Table 7.

TABLE 8

| Signal(s) | HBM Memory 406 | | | | | | | | nHGS I/O 402 |
| --- | --- | --- | --- | --- | --- | --- | --- | --- | --- |
| | Ch. 1 408-1 | Ch. 2 408-2 | Ch. 3 408-3 | Ch. 4 408-4 | Ch. 5 408-5 | Ch. 6 408-6 | Ch. 7 408-7 | Ch. 8 408-8 | |
| Dq | 128 | | 128 | | 128 | | 128 | | 512 |
| RDQS | 8 | 8 | 8 | 8 | 8 | 8 | 8 | 8 | 64 |
| WDQS | 8 | 8 | 8 | 8 | 8 | 8 | 8 | 8 | 64 |
| Dm | 16 | | 16 | | 16 | | 16 | | 64 |
| DBI | 16 | | 16 | | 16 | | 16 | | 64 |
| Rd | 8 | | 8 | | 8 | | 8 | | 32 |
| Rr | 1 | | 1 | | 1 | | 1 | | 4 |
| Rc | 1 | | 1 | | 1 | | 1 | | 4 |
| Reserved | 2 | | 2 | | 2 | | 2 | | 8 |
| PAR | 4 | | 4 | | 4 | | 4 | | 16 |

TABLE 8-continued

| | HBM Memory 406 | | | | | | | | nHGS |
|---|---|---|---|---|---|---|---|---|---|
| Sig-nal(s) | Ch. 1 408-1 | Ch. 2 408-2 | Ch. 3 408-3 | Ch. 4 408-4 | Ch. 5 408-5 | Ch. 6 408-6 | Ch. 7 408-7 | Ch. 8 408-8 | I/O 402 |
| C | 8 | | 8 | | 8 | | 8 | | 32 |
| R | 6 | | 6 | | 6 | | 6 | | 24 |
| Ck_t/ Ck_c | 2 | | 2 | | 2 | | 2 | | 8 |
| DERR | 4 | 4 | 4 | 4 | 4 | 4 | 4 | 4 | 32 |
| AERR | 1 | 1 | 1 | 1 | 1 | 1 | 1 | 1 | 8 |
| Cke | 1 | 1 | 1 | 1 | 1 | 1 | 1 | 1 | 8 |
| | | | | | | | | Total | 944 |

In the above-described examples in the context of FIG. 4, the exterior pads connected to the nHGS I/O 402 can be arranged with a density that is less than the density of the exterior pads of the HBM memory 406. The density of the exterior pads of the HBM memory 406 may be according to the corresponding generation of a HBM specification. For example, the density of the exterior pads connected to the nHGS I/O 402 can be a density designed for another technology, such as DDR4, DDR5, or the like.

Figure 5:
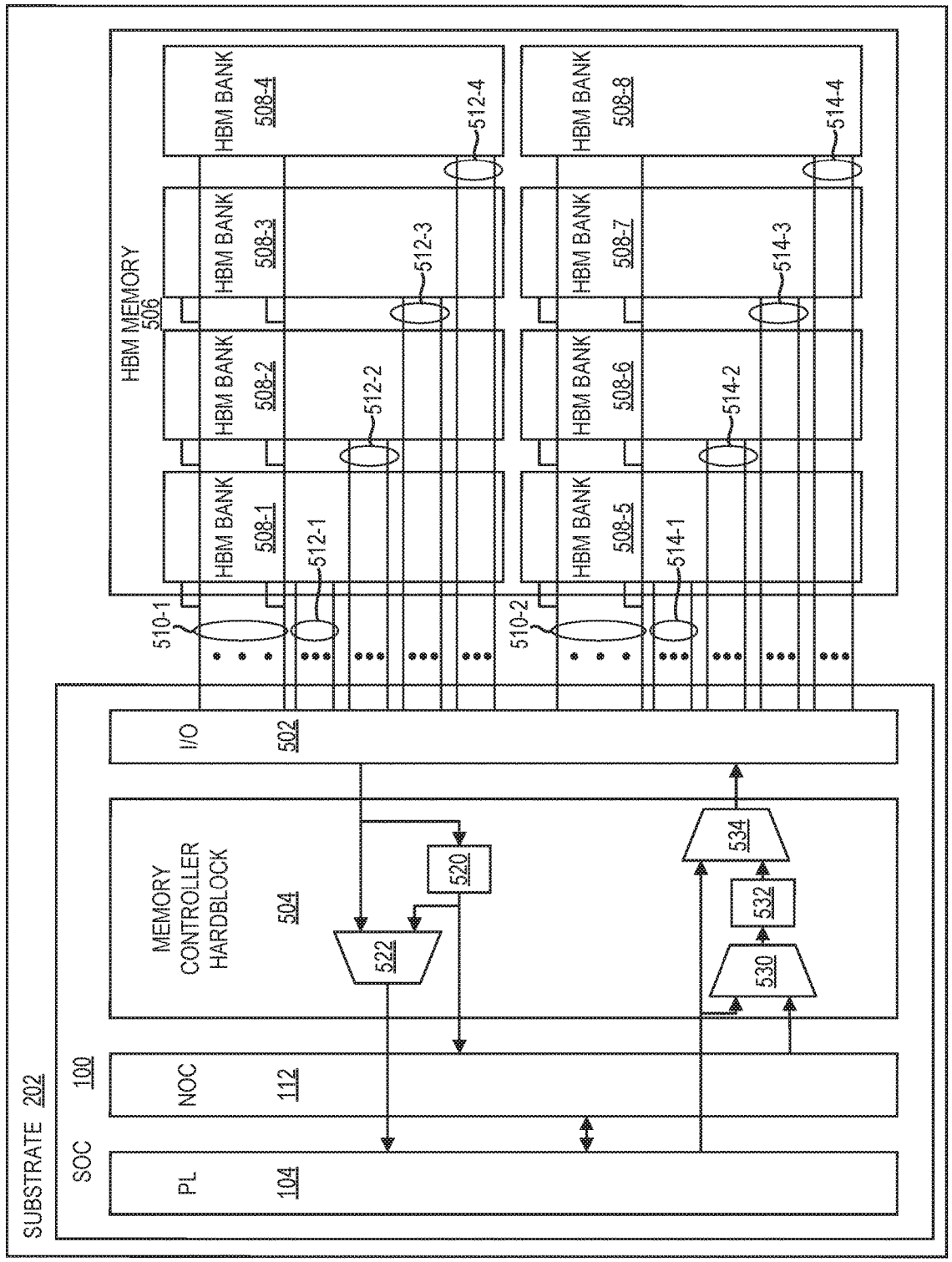

FIG. 5 illustrates an electronic device including a multi-rank HBM memory according to some examples. The electronic device in this example includes the SoC 100 of FIG. 1, although various systems or circuits can be distributed across multiple IC chips as described above in other examples.

The SoC 100 includes a nHGS I/O 502 and a nHGS memory controller hardblock 504. The nHGS I/O 502 and nHGS memory controller hardblock 504 can be implemented in a single circuit or IP block or across multiple circuits or IP blocks. The nHGS I/O 502 of the SoC 100 is communicatively coupled, via the substrate 202, to a HBM chip stack that implements HBM memory 506. The HBM chip stack (e.g., HBM memory 506) can have the interface for each of 8 channels of Table 3 when implementing the HBM2e specification. The HBM chip stack and HBM memory 506 may be used interchangeably herein. The HBM memory 506 includes HBM banks 508-1, 508-2, 508-3, 508-4, 508-5, 508-6, 508-7, 508-8, each of which implements a respective channel of the HBM memory 506.

Generally, four channels of the HBM memory 506 are connected together in parallel. In this example, no channel within the HBM memory 506 is connected in parallel with a channel within another HBM memory. As indicated, the HBM memory 506 has 8 channels in this example according to the HBM2e specification. Hence, this example has 2 groups of parallel connected channels, and each of the 2 groups has 4 channels connected in parallel.

Parallel interconnections 510-1, 510-2 are in the substrate 202 and can include metal lines and/or vias in the substrate 202. The parallel interconnections 510 generally connect four channels (e.g., four HBM banks 508) in parallel. The parallel interconnections 510-1 connect exterior pads for the HBM banks 508-1, 508-2, 508-3, 508-4, where signals for those exterior pads are capable of parallel connections for multiple channels. The parallel interconnections 510-2 connect corresponding exterior pads for the HBM banks 508-5, 508-6, t 508-7, 508-8, where signals for those exterior pads are capable of parallel connections for multiple channels. For example, respective exterior pads for data signals (Dq) for a channel 1 (e.g., HBM bank 508-1) of the HBM memory 506, for a channel 2 (e.g., HBM bank 508-2) of the HBM memory 506, for a channel 3 (e.g., HBM bank 508-3) of the HBM memory 506, and for a channel 4 (e.g., HBM bank 508-4) of the HBM memory 506 are connected together by parallel interconnections 510-1. The parallel interconnections 510 are further connected to the nHGS I/O 502 (e.g., to respective exterior pads that are connected to the nHGS I/O 502).

Channel separate interconnections 512-1, 512-2, 512-3, 512-4, 514-1, 514-2, 514-3, 514-4 are in the substrate 202 and can include metal lines and/or vias in the substrate 202. The channel separate interconnections 512-1 connect to exterior pads for signals for the HBM bank 508-1 of the HBM memory 506, where those signals are unique per channel. The channel separate interconnections 512-2 connect to exterior pads for signals for the HBM bank 508-2 of the HBM memory 506, where those signals are unique per channel. The channel separate interconnections 512-3 connect to exterior pads for signals for the HBM bank 508-3 of the HBM memory 506, where those signals are unique per channel. The channel separate interconnections 512-4 connect to exterior pads for signals for the HBM bank 508-4 of the HBM memory 506, where those signals are unique per channel. The channel separate interconnections 514-1 connect to exterior pads for signals for the HBM bank 508-5 of the HBM memory 506, where those signals are unique per channel. The channel separate interconnections 514-2 connect to exterior pads for signals for the HBM bank 508-6 of the HBM memory 506, where those signals are unique per channel. The channel separate interconnections 514-3 connect to exterior pads for signals for the HBM bank 508-7 of the HBM memory 506, where those signals are unique per channel. The channel separate interconnections 514-4 connect to exterior pads for signals for the HBM bank 508-8 of the HBM memory 506, where those signals are unique per channel. The channel separate interconnections 512, 514 are further connected to the nHGS I/O 502 (e.g., to respective exterior pads that are connected to the nHGS I/O 502). In some examples, the channel separate interconnections 512, 514 include separate interconnections for clock enable signals (Cke) for the respective HBM bank 508-1 through 508-8 of the HBM memory 506.

Table 9 below lists signals for a HBM2e specification. The HBM memory 506 has a chip stack interface that conforms to the HBM2e specification. The eight columns of Table 9 indicated by the 8 channels of the HBM memory 506 indicate the number of interconnections to the respective channels for a respective signal. A single merged cell in four columns for different channels for a signal indicates that parallel interconnections 510 connect to exterior pads of the four respective HBM banks 408 for the respective signal. A separate cell in one column for a signal indicates that channel separate interconnections 512 or 514 connect to exterior pads of the respective HBM bank 408 for the respective signal. The column of Table 9 indicated by the nHGS I/O 502 indicates the number of exterior pads on the chip that are attributable for a respective signal and connected to the interconnections and nHGS I/O 502.

TABLE 9

| | HBM Memory 506 | | | | | | | | nHGS |
|---|---|---|---|---|---|---|---|---|---|
| Sig-nal(s) | Ch. 1 508-1 | Ch. 2 508-2 | Ch. 3 508-3 | Ch. 4 508-4 | Ch. 5 508-5 | Ch. 6 508-6 | Ch. 7 508-7 | Ch. 8 08-8 | I/O 502 |
| Dq | | | 128 | | | | 128 | | 256 |
| RDQS | 8 | 8 | 8 | 8 | 8 | 8 | 8 | 8 | 64 |
| WDQS | | | 8 | | | | 8 | | 16 |
| Dm | | | 16 | | | | 16 | | 32 |

TABLE 9-continued

| Signal(s) | HBM Memory 506 | | | | | | | | nHGS I/O 502 |
| --- | --- | --- | --- | --- | --- | --- | --- | --- | --- |
| | Ch. 1 508-1 | Ch. 2 508-2 | Ch. 3 508-3 | Ch. 4 508-4 | Ch. 5 508-5 | Ch. 6 508-6 | Ch. 7 508-7 | Ch. 8 508-8 | |
| DBI | | 16 | | | | 16 | | | 32 |
| Rd | | 8 | | | | 8 | | | 16 |
| Rr | | 1 | | | | 1 | | | 2 |
| Rc | | 1 | | | | 1 | | | 2 |
| Reserved | | 2 | | | | 2 | | | 4 |
| PAR | | 4 | | | | 4 | | | 8 |
| C | | 8 | | | | 8 | | | 16 |
| R | | 6 | | | | 6 | | | 12 |
| Ck_t/Ck_c | | 2 | | | | 2 | | | 4 |
| DERR | 4 | 4 | 4 | 4 | 4 | 4 | 4 | 4 | 32 |
| AERR | 1 | 1 | 1 | 1 | 1 | 1 | 1 | 1 | 8 |
| Cke | 1 | 1 | 1 | 1 | 1 | 1 | 1 | 1 | 8 |
| | | | | | | | | Total | 512 |

Table 9 shows that 128 parallel interconnections 510-1 connect to the exterior pads for data signals (Dq) for HBM bank 508-1 (channel 1), HBM bank 508-2 (channel 2), HBM bank 508-3 (channel 3), and HBM bank 508-4 (channel 4); and 128 parallel interconnections 510-2 connect to the exterior pads for data signals (Dq) for HBM bank 508-5 (channel 5), HBM bank 508-6 (channel 6), HBM bank 508-7 (channel 7), and HBM bank 508-8 (channel 8). Additionally, Table 9 shows that these parallel interconnections 510 for the data signals (Dq) connect to 256 exterior pads connected to the nHGS I/O 502. Parallel interconnections 510 are connected to exterior pads for different signals of the respective HBM banks 508, and to exterior pads connected to the nHGS I/O 502. Those signals include the differential write data strobe (WDQS), data mask signals (Dm), data bus inversion (DBI), data, row, and column redundancy signals (Rd, Rr, Rc), reserved for future use (Reserved), parity signals (PAR), column address signals (C), row address signals (R), and differential clock signals (Ck_t/Ck_c).

Table 9 further shows that channel separate interconnections 512 or 514 connect to the exterior pads for differential read data strobe (RDQS), data error signals (DERR), address error signals (AERR), and clock enable signals (Cke) for each HBM bank 508 for respective channels 1 through 8. Channel separate interconnections 512-1 connect to the exterior pads for RDQS, DERR, AERR, and Cke for HBM bank 508-1. Channel separate interconnections 512-2 connect to the exterior pads for RDQS, DERR, AERR, and Cke for HBM bank 508-2. Channel separate interconnections 512-3 connect to the exterior pads for RDQS, DERR, AERR, and Cke for HBM bank 508-3. Channel separate interconnections 512-4 connect to the exterior pads for RDQS, DERR, AERR, and Cke for HBM bank 508-4. Channel separate interconnections 514-1 connect to the exterior pads for RDQS, DERR, AERR, and Cke for HBM bank 508-5. Channel separate interconnections 514-2 connect to the exterior pads for RDQS, DERR, AERR, and Cke for HBM bank 508-6. Channel separate interconnections 514-3 connect to the exterior pads for RDQS, DERR, AERR, and Cke for HBM bank 508-7. Channel separate interconnections 514-4 connect to the exterior pads for RDQS, DERR, AERR, and Cke for HBM bank 508-8. These channel separate interconnections 512, 514 connect to 112 exterior pads (e.g., 64, 32, 8, and 8 for RDQS, DERR, AERR, and Cke, respectively) connected to the nHGS I/O 502.

Relating the generalization above to this example, there are 2 groups of parallel connected channels, 4 channels connected in parallel per group, 200 signals per channel (all signals except RDQS, DERR, AERR, and Cke) that are connected in parallel, and 14 signals per channel (RDQS, DERR, AERR, and Cke) that are uniquely connected. Hence, 2×[200+(14×4)]=512.

Further, in this example, the nHGS I/O 502 is connected to 256 (or 128×2×1) exterior pads for data (Dq) input/output and 8 (or 1×2×4) for clock enable (Cke) output. With 128 exterior pads for data signals (Dq) per channel, the 256 exterior pads for data (Dq) input/output is a 2×1 multiple of the number of exterior pads for data signals (Dq) per channel. With 1 exterior pad for a clock enable signal (Cke) per channel, the 8 exterior pads for clock enable (Cke) input/output is a 2×4 multiple of the number of exterior pads for a clock enable signal (Cke) per channel. For a given number of groups of channels connected in parallel, the numbers of exterior pads for clock enable (Cke) output, or more generally, the number of exterior pads for signals that are uniquely connected, can increase as a function of the number of channels connected in parallel per group. Further, for a given number of groups of channels connected in parallel, the numbers of exterior pads for data (Dq) input/output, or more generally, the number of exterior pads for signals that are capable of being connected in parallel, can remain the same regardless of the number of channels connected in parallel per group. In the illustrated example, with four channels being connected in parallel in each group, the 2×4 multiples indicated above for the exterior pads for the clock enable (Cke) output is four (e.g., the number of channels connected in parallel in a group) times the 2×1 multiple for the exterior pads for the data (Dq) input/output.

The nHGS I/O 502 can include circuitry that is configured to operate according to a technology other than a HBM specification. The nHGS I/O 502 can be programmable. For example, the nHGS I/O 502 can include a physical layer (PHY) that includes drivers (e.g., buffers) and receivers that are configurable to implement different respective ranges of voltage, drive current, latency, frequency, etc. The PHY layer can be configurable to operate with non-HBM memory, such as being configurable to operate with DDR4, DDR5, or the like memory. The nHGS I/O 502 can further include circuitry that is configured to serialize/deserialize data for transmission to or upon receipt from HBM memory 506, like described above with respect to FIG. 3.

The nHGS memory controller hardblock 504 can be configured to selectively be in a bypass mode. The nHGS memory controller hardblock 504 includes processing circuits 520, 532 and multiplexers 522, 530, 534. The processing circuits 520, 532 and multiplexers 522, 530, 534 are connected and operate in bypass mode like the processing circuits 320, 332 and multiplexers 322, 330, 334 described above with respect to FIG. 3. The processing circuits 320, 332 can be programmable to process raw data according to, e.g., different technology specifications, such as DDR4, DDR5, HBM2e, HBM3, or the like.

As illustrated by Table 9 for HBM2e, 512 exterior pads connected to the nHGS I/O 502 can be on an IC chip to implement a multi-rank HBM, where four channels of a HBM memory 506 are connected in parallel with each other. The number of exterior pads connected to the nHGS I/O 502 can be reduced by omitting exterior pads for optional signals, like for data bus inversion signals (DBI) and data, row, and column redundancy signals (Rd, Rr, Rc), and/or exterior pads that are unused or reserved for future use (Reserved). Omitting these exterior pads can result in 56 less exterior pads being implemented connected to the nHGS I/O 502, although any combination or permutation of omitting any of the pads can be implemented, which may result in a smaller reduction. As examples, 480 (omitting exterior pads for data bus inversion signals (DBI)), 460 (omitting exterior pads for DBI and data, row, and column redundancy signals (Rd, Rr, Rc)), or 456 (omitting exterior pads for DBI, Rd, Rr, and Rc, and unused exterior pads (Reserved)) exterior pads connected to the nHGS I/O 502 can be on an IC chip to implement a multi-rank HBM, where four channels of a HBM memory 506 are connected in parallel with each other. In some examples, the number of exterior pads required to be implemented with the nHGS I/O 502 can be less than the standard 1712 used for previous HBM implementations.

The number of exterior pads connected to the nHGS I/O 502 and/or respective numbers of interconnections can further vary depending on the number of HBM memories connected together in the multi-rank HBM, and/or the generation of the HBM specification that is implemented. Any number of HBM memories can be implemented. The parallel interconnections 510 can further be connected to the additional HBM memories, and different respective channel separate interconnections can be added for each channel of the additional HBM memories. Accordingly, the number of exterior pads connected to the nHGS I/O 502 can increase based on the additional channel separate interconnections that are implemented for the additional HBM memories. Further, different generations of HBM can implement different signals and/or numbers of signals, which can result in a different number of exterior pads connected to the nHGS I/O 502 and/or different numbers of interconnections being implemented.

In further examples, signals described above in the context of Table 9 being implemented on parallel interconnections 510 can be implemented on channel separate interconnections 512, 514. For example, the differential write data strobe (WDQS) can be implemented on channel separate interconnections 512, 514, which can result in an increase in exterior pads connected to the nHGS I/O 502. Table 10 below illustrates such an implementation. A person having ordinary skill in the art will readily understand Table 10 in view of the preceding description of Table 9.

TABLE 10

| Signal(s) | HBM Memory 506 | | | | | | | | nHGS I/O 502 |
|---|---|---|---|---|---|---|---|---|---|
| | Ch. 1 508-1 | Ch. 2 508-2 | Ch. 3 508-3 | Ch. 4 508-4 | Ch. 5 508-5 | Ch. 6 508-6 | Ch. 7 508-7 | Ch. 8 508-8 | |
| Dq | | | | 128 | | | | | 256 |
| RDQS | 8 | 8 | 8 | 8 | 8 | 8 | 8 | 8 | 64 |

TABLE 10-continued

| Signal(s) | HBM Memory 506 | | | | | | | | nHGS I/O 502 |
|---|---|---|---|---|---|---|---|---|---|
| | Ch. 1 508-1 | Ch. 2 508-2 | Ch. 3 508-3 | Ch. 4 508-4 | Ch. 5 508-5 | Ch. 6 508-6 | Ch. 7 508-7 | Ch. 8 508-8 | |
| WDQS | 8 | 8 | 8 | 8 | 8 | 8 | 8 | 8 | 64 |
| Dm | | 16 | | | | 16 | | | 32 |
| DBI | | 16 | | | | 16 | | | 32 |
| Rd | | 8 | | | | 8 | | | 16 |
| Rr | | 1 | | | | 1 | | | 2 |
| Rc | | 1 | | | | 1 | | | 2 |
| Reserved | | 2 | | | | 2 | | | 4 |
| PAR | | 4 | | | | 4 | | | 8 |
| C | | 8 | | | | 8 | | | 16 |
| R | | 6 | | | | 6 | | | 12 |
| Ck_t/Ck_c | | 2 | | | | 2 | | | 4 |
| DERR | 4 | 4 | 4 | 4 | 4 | 4 | 4 | 4 | 32 |
| AERR | 1 | 1 | 1 | 1 | 1 | 1 | 1 | 1 | 8 |
| Cke | 1 | 1 | 1 | 1 | 1 | 1 | 1 | 1 | 8 |
| | | | | | | | | Total | 560 |

In the above-described examples in the context of FIG. 5, the exterior pads connected to the nHGS I/O 502 can be arranged with a density that is less than the density of the exterior pads of the HBM memory 506. The density of the exterior pads of the HBM memory 506 may be according to the corresponding generation of a HBM specification. For example, the density of the exterior pads connected to the nHGS I/O 502 can be a density designed for another technology, such as DDR4, DDR5, or the like.

The above-described examples in the context of FIGS. 4 and 5 can implement multi-rank HBM while permitting flexibility of use for the SoC 100. For example, the SoC 100 can be incorporated into many different products, some of which may not implement HBM. In situations where the SoC 100 is incorporated into a product without HBM, the memory controller and I/Os of the SoC 100 can be repurposed for other technologies, such as DDR4, DDR5, or the like. The SoC 100 can therefore obviate having a dedicated HGS memory controller and HGS I/O that is unused in such products. This can permit higher utilization of the area of the IC chip of the SoC 100 across all products in which the SoC 100 is incorporated, which can further reduce costs of the SoC 100 for all such products.

Multi-rank as taught herein can permit a HBM chip stack to be connected using future package metal line pitch capabilities and/or intermediate metal line density improvements. Table 11 below shows how multi-rank can impact metal line density for HBM chip stack to IC chip connections.

TABLE 11

| | (1) MR metal lines | (2) HBM metal line/mm | (3) Minimum 2 layer pitch (mm) | (4) Minimum 4 layer pitch (mm) | (5) I/O metal line/mm | (6) Minimum 2 layer pitch (mm) | (7) Minimum 4 layer pitch (mm) |
|---|---|---|---|---|---|---|---|
| HBM2e Std. | 1712 | 283 | 0.0071 | 0.0141 | 169 | 0.0141 | 0.0283 |
| HBM2e MRx2 | 1824 | 301 | 0.0066 | 0.0133 | 169 | 0.0133 | 0.0265 |
| HBM2e MR/2 | 912 | 151 | 0.0133 | 0.0265 | 85 | 0.0265 | 0.0531 |
| HBM2e MR/4 | 512 | 85 | 0.0236 | 0.0473 | 42 | 0.0473 | 0.0945 |

Table 11 above shows 4 rows for various HBM2e interfaces. The HBM2e Std. is the default state of a HBM2e interface. HBM2e MR×2 is the case where a single HBM interface is used to drive two HBM chip stacks, like in FIG. 3 and Table 5. Note in this case the metal line count and metal line density actually increases relative to the HBM2e Std. HBM2e MR/2 is the multi-rank hook-up that enables one HBM channel on an IC chip (e.g., IC chip 204) to drive two HBM chip stack channels, like in FIG. 4 and Table 7, which reduces signal count and metal line density relative to the HBM2e Std. HBM2e MR/4 is the multi-rank hook-up that enables one HBM channel on an IC chip (e.g., IC chip 204) to drive four HBM stack channels, like in FIG. 5 and Table 9, which further reduces signal count and metal line density. Multi-rank (MR) metal lines (column (1)) is the chip-to-chip connection count for each HBM mode. HBM metal line/mm (column (2)) is the metal line density at the HBM chip stack I/O interface. The left two columns Minimum 2 layer pitch (column (3)) and Minimum 4 layer pitch (column (4)) show the theoretical minimum metal line pitch in, e.g., the substrate 202 to connect the IC chip 204 to the HBM chip stack 206. Actual density including VIA and power overhead may be, for example, +/−10% different based on layout and signal integrity considerations. The I/O metal line/mm column (column (5)) shows the metal line density at the I/O of the IC chip driving the HBM chip stack. In this case the I/O width is assumed to be the full width of the HBM2e chip stack, such as 12 mm as opposed to the 6.05 mm width of the actual HBM I/O under the HBM chip stack. The metal line density and minimum pitch in column (5) is about half that of the HBM interface region in column (2). The HBM interface I/O can be used to connect two chips with HBM interface I/O using the HBM interface I/O. In this case, an IC chip to IC chip connection can use the HBM interface standard but a much less advanced interconnect technology than a connection to a HBM chip stack. The Minimum 4 layer package pitch (column (7)) for some multi-rank modes are within the capability of projected future metal line pitch densities and intermediate metal line densities. Using HBM for chip-to-chip connections would be possible in some modes with current package technology, and in the future, any multi-rank I/O reduction modes could be implemented in any substrate in a package.

Figure 6:
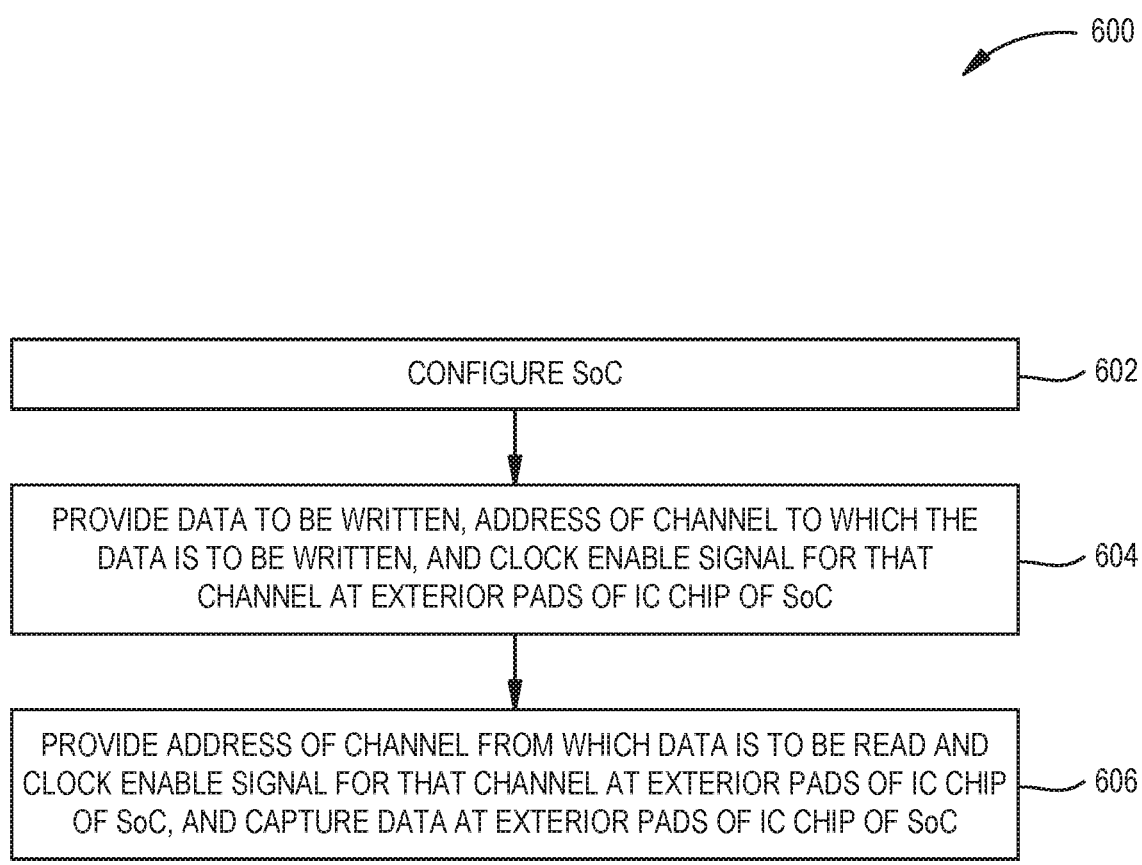
FIG. 6 is a flowchart of a method of operating an electronic device that includes multi-rank HBM memory according to some examples.

FIG. 6 is a flowchart of a method 600 of operating an electronic device that includes multi-rank HBM memory according to some examples. The electronic device can have any of the architectures as described above with respect to FIGS. 3 through 5, for example.

At block 602, an SoC is configured. In some examples, block 602 can be omitted. For example, where the I/O circuit and memory controller HB circuit are hardened and not programmable, block 602 can be omitted. The SoC can be configured by loading and instantiating configuration data, such as in a boot image file and/or bitstream, on the SoC. Configuring the SoC can include configuring a memory controller HB circuit, I/O circuit, and/or PL. For example, where the I/O circuit is nHGS, the I/O circuit can be configured or programmed in a HBM-generation-specific mode consistent with the HBM generation specification, such as by programming an output voltage range, a drivability, etc. of the I/O circuit. The memory controller HB circuit can be configured by programming the memory controller HB circuit to be in a multi-rank HBM mode or a standard HBM mode, for example, when the memory controller HB circuit is a HGS memory controller. The memory controller HB circuit can be configured by programming the memory controller HB circuit to implement a multi-rank HBM mode, for example, when the memory controller HB circuit is an nHGS memory controller. Additionally, in some examples, the memory controller HB circuit can be configured to be in a bypass mode, such that a memory controller is instantiated in the PL. The PL can be configured to implement the memory controller, in some examples. Additionally, the SoC can be configured including configuring the PL to instantiate a user application, configuring the programmable network of the NoC, and/or configuring other programmable components of the SoC. The configurability of the SoC can vary. In some examples, the SoC is an application specific IC (ASIC) that is not programmable (and block 602 can be omitted), while in other examples, the SoC can include an FPGA with multiple other programmable components.

At block 604, data to be written, the address of a channel to which the data is to be written, and the clock enable signal for that channel are provided at appropriate exterior pads of the IC chip of the SoC. The memory controller (whether implemented by the memory controller HB circuit or instantiated on the PL) can provide the data, address, and clock enable signal, which may further be provided through the I/O circuit. The data to be written is provided at exterior pads (of the IC chip of the SoC) connected to parallel interconnections (e.g., parallel interconnections 310, 410, 510) that are connected to the channel (or bank) of the HBM memory to which the data is to be written. Similarly, the address (column and row) is provided at exterior pads (of the IC chip of the SoC) connected to parallel interconnections (e.g., parallel interconnections 310, 410, 510) that are connected to the channel (or bank) of the HBM memory to which the data is to be written. The clock enable signal is asserted enabled at an exterior pad (of the IC chip of the SoC) connected to a channel separate interconnection (e.g., channel separate interconnection 312, 412, 414, 416, 418, 512, 514) that is connected to the channel (or bank) of the HBM memory to which the data is to be written.

As an example, referring to FIG. 5, assume data is to be written to a location in HBM bank 508-2. In such example, the data is provided from nHGS I/O 502 on parallel interconnections 510-1, the column and row signals are provided from nHGS I/O 502 on parallel interconnections 510-1, and the clock enable signal is provided from nHGS I/O 502 on channel separate interconnection 512-2. Other signals and data are provided from nHGS I/O 502 on various parallel and channel separate interconnections as indicated by examples above, and as a person having ordinary skill in the art will readily understand. Providing this data and signals writes data to a memory location of the targeted channel of the multi-rank HBM memory.

At block 606, the address of a channel from which data is to be read and the clock enable signal for that channel are provided at appropriate exterior pads of the IC chip of the SoC, and data is captured at appropriate exterior pads of the IC chip of the SoC. The memory controller (whether implemented by the memory controller HB circuit or instantiated on the PL) can provide the address and clock enable signal, and may capture the data that is read. The address, clock enable, signal, and read data may further be provided or captured through the I/O circuit. The address (column and row) is provided at exterior pads (of the IC chip of the SoC) connected to parallel interconnections (e.g., parallel interconnections 310, 410, 510) that are connected to the channel (or bank) of the HBM memory from which data is to be read. The clock enable signal is asserted enabled at an exterior pad (of the IC chip of the SoC) connected to a channel separate interconnection (e.g., channel separate interconnection 312, 412, 414, 416, 418, 512, 514) that is connected to the channel (or bank) of the HBM memory from which the data is to be read. The HBM chip stack that includes the channel from which the data is read outputs the data on parallel interconnections (e.g., parallel interconnections 310, 410, 510) that are connected to the channel (or bank) of the HBM memory from which the data is to be read. The read data is received at exterior pads (of the IC chip of the SoC) connected to the parallel interconnections on which the read data is output.

As an example, referring to FIG. 5, assume data is to be read from a location in HBM bank 508-2. In such example, the column and row signals are provided from nHGS I/O 502 on parallel interconnections 510-1, and the clock enable signal is provided from nHGS I/O 502 on channel separate interconnection 512-2. The HBM memory 506 outputs the data on parallel interconnections 510-1, and the nHGS I/O 502 receives the data from the parallel interconnections 510-1. Other signals and data are provided on various parallel and channel separate interconnections as indicated by examples above, and as a person having ordinary skill in the art will readily understand. Providing this data and signals reads data from a memory location of the targeted channel of the multi-rank HBM memory.

When reading data, the memory controller (e.g., whether implemented by the memory controller HB circuit or instantiated on the PL) logically ORs the differential read data strobe signals Rdqs_t received from each of the corresponding channel separate interconnections to create a multi-rank differential read data strobe signal Rdqs_t, and logically ANDs the differential read data strobe signals Rdqs_c received from each of the corresponding channel separate interconnections to create a multi-rank differential read data strobe signal Rdqs_c.

By having the clock enable signals for the channels being separated on respective channel separate interconnections, a channel can be enabled by an asserted enabled clock enable signal for that channel to read from and/or write to a memory location in that channel while other channels are disabled. Hence, even though multiple channels may receive data and/or an address during a read or write operation, channels that receive an asserted enabled clock enable signal perform the associated read or write operation, while other channels remain disabled and do not perform the associated read or write operation.

While the foregoing is directed to specific examples, other and further examples may be devised without departing from the basic scope thereof, and the scope thereof is determined by the claims that follow.

What is claimed is:

1. An electronic device comprising:
    a first chip comprising an interface circuit connected to first exterior pads, the first exterior pads having a first number of first data input/output exterior pads and a second number of clock enable output exterior pads, the first number being a first integer multiple of a number of data signals per channel of high bandwidth memory (HBM), the second number being a second integer multiple of a number of clock enable signals per channel of the HBM, the second integer multiple being greater than the first integer multiple.

2. The electronic device of claim 1, wherein the second integer multiple is an integer multiple of and is at least two times the first integer multiple.

3. The electronic device of claim 1, wherein the interface circuit is an HBM-generation-specific interface circuit.

4. The electronic device of claim 3 further comprising:
    a substrate, the first chip being attached to the substrate using the first exterior pads;
    a first HBM chip stack attached to the substrate using second exterior pads of the first HBM chip stack, the second exterior pads having the first number of second data input/output exterior pads and a third number of first clock enable input exterior pads; and
    a second HBM chip stack attached to the substrate using third exterior pads of the second HBM chip stack, the third exterior pads having the first number of third data input/output exterior pads and the third number of second clock enable input exterior pads,
    wherein:
        ones of the first data input/output exterior pads are electrically connected, via the substrate, to both of respective ones of the second data input/output exterior pads and respective ones of the third data input/output exterior pads;
        a first subset of ones of the clock enable output exterior pads are electrically connected, via the substrate, to respective ones of the first clock enable input exterior pads; and
        a second subset of ones of the clock enable output exterior pads are electrically connected, via the substrate, to respective ones of the second clock enable input exterior pads, none of the first clock enable input exterior pads being electrically connected to any of the second clock enable input exterior pads.

5. The electronic device of claim 4, wherein the substrate is an organic interposer.

6. The electronic device of claim 4, wherein the substrate is a wafer-level fan-out.

7. The electronic device of claim 4, wherein the substrate is a package substrate.

8. The electronic device of claim 4, wherein the substrate is a semiconductor-based interposer.

9. The electronic device of claim 4, wherein a density of the first exterior pads is less than a density of the second exterior pads.

10. The electronic device of claim 1, wherein the interface circuit comprises:
    a programmable non-HBM-specific input/output circuit connected to the first exterior pads, wherein the programmable non-HBM-specific input/output circuit is configured to be programmable in an HBM-generation-specific mode; and
    a non-HBM-specific memory controller connected to the programmable non-HBM-specific input/output circuit.

11. The electronic device of claim 10, wherein the non-HBM-specific memory controller is programmable.

12. The electronic device of claim 10 further comprising:
    a substrate, the first chip being attached to the substrate using the first exterior pads; and
    an HBM chip stack attached to the substrate using second exterior pads of the HBM chip stack, the second exterior pads having a third number of second data input/output exterior pads and the second number of clock enable input exterior pads,
    wherein:
        the third number is greater than the first number;
        ones of the first data input/output exterior pads are electrically connected, via the substrate, to respective ones of a first subset of the second data input/output exterior pads, ones of the first subset of the second data input/output exterior pads being electrically connected to respective ones of a second subset of the second data input/output exterior pads; and ones of the clock enable output exterior pads are electrically connected, via the substrate, to respective ones of the clock enable input exterior pads.

13. The electronic device of claim 12, wherein the substrate is an organic interposer.

14. The electronic device of claim 12, wherein the substrate is a wafer-level fan-out.

15. The electronic device of claim 12, wherein the substrate is a package substrate.

16. The electronic device of claim 12, wherein the substrate is a semiconductor-based interposer.

17. The electronic device of claim 12, wherein a density of the first exterior pads is less than a density of the second exterior pads.

18. A method of operating an electronic device, the method comprising:
   writing, through an interface circuit of an integrated circuit (IC) chip, data to memory of one or more high bandwidth memory (HBM) chip stacks, the IC chip being disposed on and attached to a substrate, the interface circuit being connected to exterior pads of the IC chip, the one or more HBM chip stacks being disposed on and attached to the substrate, respective data exterior pads of a plurality of channels of the one or more HBM chip stacks being connected in parallel through parallel interconnections in the substrate, clock enable exterior pads of the plurality of channels of the one or more HBM chip stacks being connected to channel separate interconnections in the substrate, the parallel interconnections and the channel separate interconnections being connected to the exterior pads of the IC chip connected to the interface circuit; and
   reading, through the interface circuit, data from memory of the one or more HBM chip stacks; and
   wherein, during the writing and reading, data that is written and read, respectively, is communicated through respective parallel interconnections, and a clock enable signal is asserted enabled through a channel separate interconnection.

19. The method of claim 18 further comprising configuring a programmable non-HBM-specific input/output circuit of the interface circuit in an HBM-generation-specific mode, the programmable non-HBM-specific input/output circuit being connected to the exterior pads of the IC chip.

20. An electronic device comprising:
   a substrate;
   an integrated circuit (IC) chip disposed on and attached to the substrate, the IC chip including an interface circuit connected to exterior pads; and
   one or more high bandwidth memory (HBM) chip stacks disposed on and attached to the substrate, respective data exterior pads of a plurality of channels of the one or more HBM chip stacks being connected in parallel through parallel interconnections in the substrate, clock enable exterior pads of the plurality of channels of the one or more HBM chip stacks being connected to channel separate interconnections in the substrate, the parallel interconnections and the channel separate interconnections being connected to the exterior pads of the IC chip connected to the interface circuit.

\* \* \* \* \*

UNITED STATES PATENT AND TRADEMARK OFFICE
CERTIFICATE OF CORRECTION

PATENT NO. : 11,189,338 B1
APPLICATION NO. : 16/833043
DATED : November 30, 2021
INVENTOR(S) : Rafael C. Camarota It is certified that error appears in the above-identified patent and that said Letters Patent is hereby corrected as shown below:

In the Claims

Column 31, Line 63-64, In Claim 2, after "second integer multiple" delete "is an integer multiple of and".

Signed and Sealed this
Twenty-sixth Day of April, 2022

Katherine Kelly Vidal
*Director of the United States Patent and Trademark Office*